United States Patent
Dang et al.

(10) Patent No.: US 11,817,359 B2
(45) Date of Patent: Nov. 14, 2023

(54) WARP MITIGATION USING PATTERN-MATCHED METAL LAYERS IN ORGANIC SUBSTRATES

(71) Applicant: International Business Machines Corporation, Armonk, NY (US)

(72) Inventors: Hien Dang, Nanuet, NY (US); Sri M. Sri-Jayantha, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 280 days.

(21) Appl. No.: 17/009,006

(22) Filed: Sep. 1, 2020

(65) Prior Publication Data
US 2022/0068735 A1    Mar. 3, 2022

(51) Int. Cl.
*H01L 23/14*    (2006.01)
*H01L 21/48*    (2006.01)
(Continued)

(52) U.S. Cl.
CPC .......... *H01L 23/145* (2013.01); *G06F 30/392* (2020.01); *G06F 30/398* (2020.01);
(Continued)

(58) Field of Classification Search
CPC . H01L 23/145; H01L 21/027; H01L 21/4857; H01L 23/49822; H01L 23/49838;
(Continued)

(56) References Cited

U.S. PATENT DOCUMENTS 6,392,301 B1 * 5/2002 Waizman ............. H05K 1/0253
                                                       428/209
7,139,678 B2   11/2006 Kobayashi et al.
(Continued)

FOREIGN PATENT DOCUMENTS

JP    WO2007052422    4/2009

OTHER PUBLICATIONS

Seunghyun Cho, Joseph Lee, Hyungpi Park, Yb Ko, "New dummy design and stifener on warpage reduction in Ball Grid Array Printed Circuit Board", "Microelectronics Reliabiltiy", Feb. 2010.

*Primary Examiner* — Fazli Erdem
(74) *Attorney, Agent, or Firm* — Daniel P. Morris; Lou Percello, Attorney, PLLC

(57) ABSTRACT

An organic substrate that has one or more layers. Each of the layers is made of one or more sub-patterns of conductive material disposed on a non-conductive material. The layers are divided into one or more tile subareas. A corresponding layer pair has a corresponding upper layer (with corresponding upper tile subareas) and a corresponding lower layer (with corresponding lower tile subareas) that are equidistant from and symmetric about a reference plane. Each corresponding upper tile subarea and the corresponding lower tile subarea are in a same vertical projection.

A symmetric upper (lower) layout on the corresponding upper (lower) tile subarea replaces an original corresponding upper (lower) layer. The symmetric upper and lower layouts have one or more upper portions that have no electrical function but are partly responsible for making the symmetric lower layout and symmetric upper layout more thermomechanically symmetric and help reduce warp.

19 Claims, 17 Drawing Sheets

(51) Int. Cl.
*G06F 30/392* (2020.01)
*H01L 21/027* (2006.01)
*H01L 23/498* (2006.01)
*G06F 30/398* (2020.01)

(52) U.S. Cl.
CPC ........ *H01L 21/027* (2013.01); *H01L 21/4857* (2013.01); *H01L 23/49822* (2013.01); *H01L 23/49838* (2013.01); *H01L 23/49894* (2013.01)

(58) Field of Classification Search
CPC ........... H01L 23/49894; H01L 23/5383; H01L 23/562; H01L 23/53228; H01L 27/0207; H01L 2924/15311; H01L 2224/16225; H01L 21/02; H01L 21/48; H01L 23/14; H01L 23/49; H01L 23/49816; G06F 30/392; G06F 30/398; G06F 30/367; G06F 30/17; G06F 30/327; G06F 2119/08; G06F 2115/12; G06F 2113/18
USPC .......................................................... 257/40
See application file for complete search history.

(56) References Cited

U.S. PATENT DOCUMENTS

| | | | |
|---|---|---|---|
| 7,222,316 B2 | 5/2007 | Fukuzono et al. | |
| 7,901,998 B2 | 3/2011 | Sri-Jayantha et al. | |
| 7,996,196 B2 | 8/2011 | Mizutani et al. | |
| 9,355,967 B2 | 5/2016 | Kim et al. | |
| 9,659,131 B2 | 5/2017 | Blackshear et al. | |
| 9,867,284 B2 | 1/2018 | Kreutzwiesner et al. | |
| 2007/0176317 A1* | 8/2007 | Morita | B29C 43/50 264/272.17 |
| 2010/0031213 A1 | 2/2010 | Kawamichi et al. | |
| 2010/0115763 A1* | 5/2010 | Kim | H01L 24/81 29/740 |
| 2013/0334711 A1* | 12/2013 | Blackshear | G06F 30/20 257/E23.06 |
| 2014/0078704 A1* | 3/2014 | Andry | H01L 23/49827 361/764 |
| 2014/0307403 A1* | 10/2014 | Weichslberger | H05K 1/183 361/761 |
| 2016/0351419 A1* | 12/2016 | Lin | H01L 21/561 |
| 2017/0351783 A1 | 12/2017 | Call et al. | |
| 2020/0091074 A1* | 3/2020 | Dang | G06F 30/398 |
| 2022/0068735 A1* | 3/2022 | Dang | H01L 23/49894 |

* cited by examiner

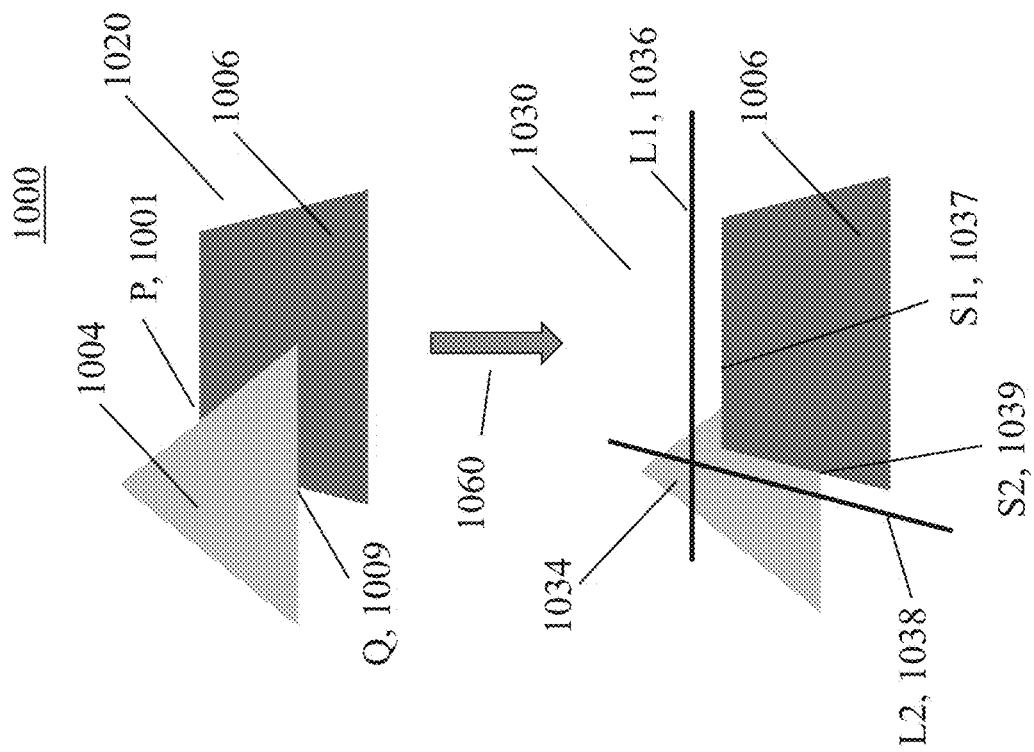
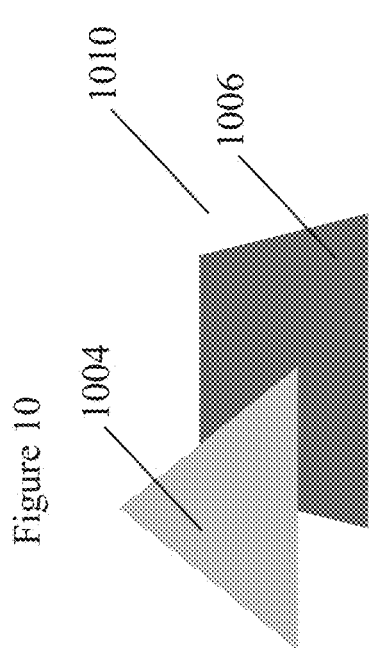
Figure 10

WARP MITIGATION USING PATTERN-MATCHED METAL LAYERS IN ORGANIC SUBSTRATES

BACKGROUND

The present invention relates to minimizing stress, strain, and warping in the organic substrates. More specifically, the invention relates to reducing stress in organic substrates to prevent dielectric failure of internal circuitry in attached semiconductor chips, underfill attachment, and organic substrate delamination.

To support the fast pace of advancements in electronics, i.e. Moore's law, board designers are pushing organic substrates to the limits. Substrates have grown from 40×40 millimeters to over 70×70 millimeters with finer interconnects and more complex layers. Even though the chips and the substrates are getting larger, the same industry standards for flatness still are requirements for these substrates. As the result, a lot more parts are being rejected for failing specs, often due to substrate wrap.

Two major components contribute to substrate warp: i. poor initial design and ii. contribution from the manufacturing process and material mismatch. The former component can be controlled by the substrate designer.

Organic substrates typically have a core about 400-800 micrometers (μm) thick made of fiber reinforced organic or resin material. In some instances, to reduce cost, the core is eliminated in the substrate, e.g. in coreless substrates, so the "core" becomes a hypothetical reference plane at the center of the substrate.

Metal and/or metal interconnection layers, or sub-patterns, are progressively built layer by layer upon one another on the top and bottom of the core/reference plane by a series of process steps. Each of the substrate circuit interconnection layers or power/ground planes is separated by a sheet of photosensitive resin. The steps that build the layers involve electroless-plating, electroplating, etching, polishing, placement of dielectric resin, high temperature pressing of resin, etc. Laser drilling of the resin and electroplating processes are used to fabricate vias that help connect various layers. Multi-stack vias are used to link metal connections in different layers of the substrate.

The buildup layers between the chip/die and the core are referred to as "FC" layers (Front Circuit) and the layers on the side of the core opposite the chip are referred to as "BC" (Bottom Circuit) layers. Since each metal layer is designed to optimize electrical performance, the mechanical characteristics of each layer and the sub-patterns on the layer are not precisely controlled during the electrical design. The FC layers generally have a dense interconnect structure made of metal lines, typically etched from a layer of copper deposited by means of a plating process. The BC layers, on the other hand, tend to have a continuous sheet of metal (e.g. copper) with distributed holes for vias to pass through. Such configurations inevitably lead to a substrate with asymmetric thermomechanical properties including stress, strain, and warp.

Because the layers are built of different materials each layer responds differently to thermal and/or mechanical cycles the substrate undergoes. Temperature and/or mechanical cycling during stages of manufacture and assembly and during operation produce stresses, strains, and warping in the substrate, layers of the substrate, attached components, and connections. Particularly, these effects occur when the substrate is heated to reflow solder connections to attach semiconductor chips (chip) to the substrate, e.g. during a flip-chip assembly process. During these cycles one or more of the layers of the substrate can delaminate. As a result, the yield of operable substrates is reduced and operational failures increase. Failures can also occur due to thermal cycling of the assembly during normal operation.

There is a need to mitigate the warping effects in organic substrates to improve manufacturing yields and minimize failures related to thermal and mechanical cycling of organic substrates and structures during device operation. There is also a need to integrate these designs easily in existing substrate manufacturer and electronic software company design and assembly processes.

SUMMARY

Embodiments of the present invention include an organic substrate that has one or more layers. Each of the layers is made of one or more sub-patterns of conductive material disposed on a non-conductive material. One or more of the sub-patterns of conductive material is in one of one or more tile subareas of each of the layers. One or more of the layers is an upper layer on an upper side of a flat referenced plane and one or more of the layers is a lower layer on a lower side of the flat reference plane.

One or more corresponding layer pairs are defined. Each corresponding layer pair has one of the upper layers, called a corresponding upper layer, and one of the lower layers, called a corresponding lower layer. The corresponding upper layer and the corresponding lower layer are equidistant from and symmetric about the flat reference plane.

One or more corresponding tile subareas are defined. Each of the corresponding tile subareas has one of the upper tile subareas in the corresponding upper layer, called a corresponding upper tile subarea, and one of the lower tile subareas in the corresponding lower area, called a corresponding lower tile subarea. The corresponding upper tile subarea and the corresponding lower tile subarea are in a same vertical projection.

Once processed by methods disclosed, a symmetric upper layout on the corresponding upper tile subarea replaces an original corresponding upper layer. The symmetric upper layout has one or more upper portions that have no electrical function.

Once processed by methods disclosed, a symmetric lower layout on the corresponding lower tile subarea replaces an original corresponding lower layer. The symmetric lower layout has one or more lower portions that have no electrical function.

While the upper portions and lower portions have no electrical function, they are partly responsible for making the symmetric lower layout and symmetric upper layout more thermo-mechanically symmetric and help reducing warp in the organic substrate. In some embodiments, the conductive material in the symmetric upper layout and the symmetric lower layout, respectively, are equal in surface area within a tolerance and are vertical projections of one another. In some embodiments, the tolerance is 2 percent or less.

Alternative methods of making organic substrates with reduced warp are disclosed. Bitmap symmetric methods are compatible with existing manufacturing processes. Layout symmetric methods, while also compatible with existing manufacturing process, further interface with testing techniques.

BRIEF DESCRIPTION OF THE DRAWINGS

FIG. 10 is a sequence of configurations describing how a two general, polygonal, intersecting structures are processed in a combined major feature structure to produce an electrically functioning and symmetric layer structure in a layout-symmetric embodiment.

DETAILED DESCRIPTION

Figures 1A, 1B:
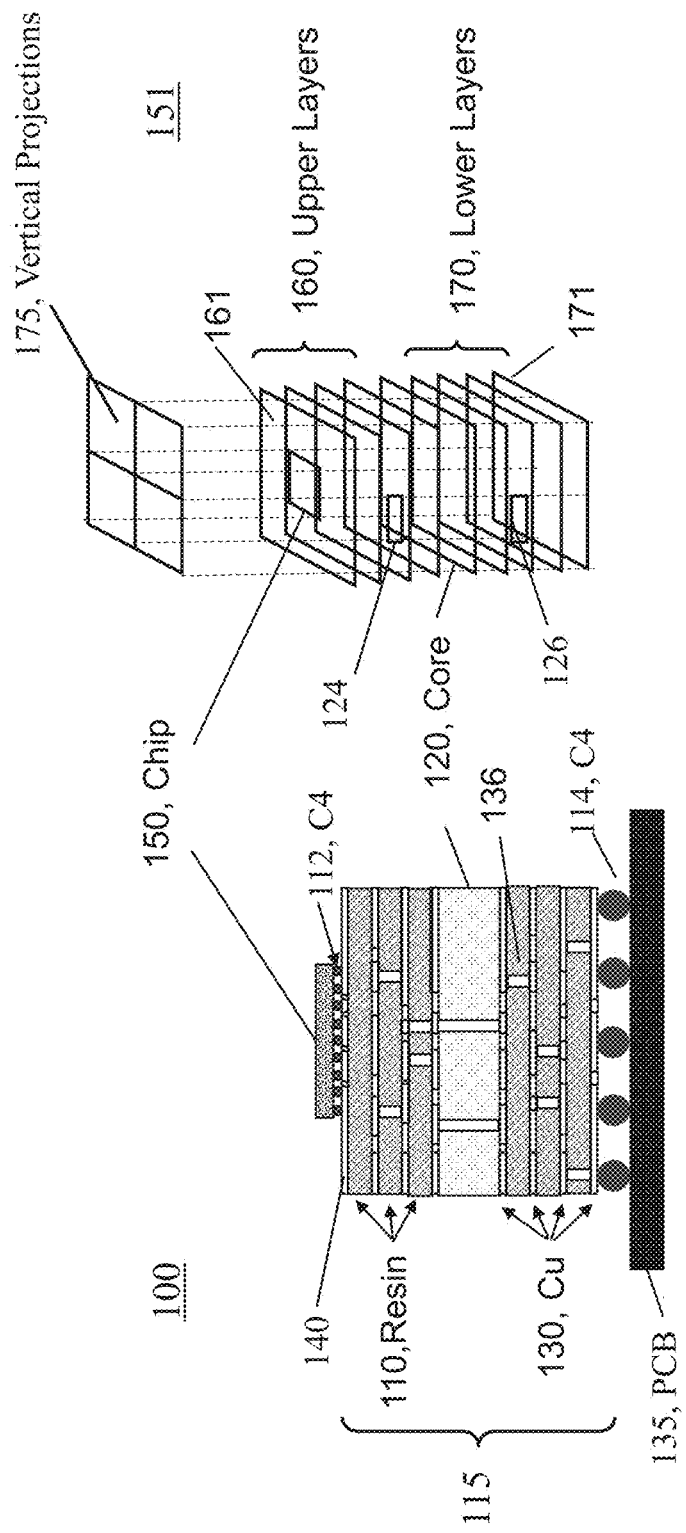
FIG. 1A is an illustrative block diagram of one embodiment of a laminated structure including an organic substrate.
FIG. 1B is an isometric view of the laminated structure showing upper and lower layers with vertical projections defining tile subareas and line sub-patterns.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures may not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly"

used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Opposing/corresponding layers and/or sub-patterns in one or more corresponding layer pairs in an organic substrate are made symmetrical to minimize thermal warp. An upper (FC) and lower (BC) layer (and/or their sub-patterns) are selected to make up a corresponding layer pair in the organic substrate. In some embodiments, the upper and lower layer are selected in the corresponding layer pair because they are each equidistant from a reference plane, i.e. placed symmetrically about the reference plane. The original upper layer/layout (and/or sub-patterns) of each of the corresponding layer pairs is modified to become a symmetric upper layout. The original lower layer/layout (and/or sub-patterns) of each of the corresponding layer pairs is modified to become a symmetric lower layout. The modified symmetric upper and lower layers become a symmetric layer pair. The symmetric layer pair have more symmetric regions of metal on their surfaces and warp the organic substrate much less than the original upper and lower layers in the corresponding layer pairs because the warping effects of the respective symmetric upper and lower layers is balanced/symmetric about the core. The modified symmetric upper and lower layers in the symmetric layer pair also are electrically equivalent to the original upper and lower layers, respectively.

In some embodiments, more than one corresponding layer pairs are modified into symmetric layer pairs. In some embodiments, the original (upper and lower) layers in the corresponding layer pairs are modified into modified symmetric upper and lower layers by modifying one or more upper and lower tile subareas (with sub-patterns) in the respective original upper and lower layers in the corresponding layer pairs and then combining the upper/lower tile subareas to make the respective modified symmetric upper/lower layers forming the symmetric layer pair.

Alternative embodiments are disclosed to modify the original upper and lower (tile subareas) of the original corresponding layer pairs, e.g. a Bitmap-Symmetric embodiment and a Layout-Symmetric embodiment.

A Bitmap-Symmetric embodiment modifies original bitmap designs/representations to create symmetric bitmap design representations. The symmetric bitmap designs function with electronic board layout technology to create more symmetric masks for each of one or more layers in the organic substrate. The Bitmap-Symmetric embodiment is versatile and can integrate into current manufacturing systems using image processing techniques. However, the symmetric bitmap designs can be difficult to pre-test to find electrical and/or mechanical design errors in the final designs.

An alternative Layout-Symmetric embodiment modifies the original designs by resolving one or more original non-symmetric sub-patterns into more symmetric sub-patterns. The symmetric sub-patterns are integrated into the respective upper and lower layers to form the modified symmetric upper and lower layers in the symmetric layer pair. This embodiment can be integrated with layer layout technology that includes and/or interfaces with testing technology. These embodiments can be tested and re-worked to identify and correct design errors during the design phase.

The Bitmap-Symmetric and the Layout-Symmetric embodiments modify one or more respective original upper and lower layers (tile subareas) of the original corresponding layer pairs to form one or more respective symmetric layer pairs (each with their symmetric upper and lower layers). Organic substrates made with the symmetric layer pairs will warp less and experience less thermal stress than organic substrates with the original designs.

In addition, the modified organic substrates must perform the electrical function enabled the original design. While the modified organic substrate will be more symmetric and warp less, some connection errors/artifacts can be caused by the process, e.g. unwanted short and/or open circuits are created in error during the modifications. Accordingly, electrical errors are identified and corrected in the modified organic substrate in a way that minimizes thermal stress and warp in the final design of the organic substrate.

There are alternative ways disclosed to integrate embodiments of the invention into existing manufacturing technologies.

Refer now to the Figures.

FIG. 1A is a block diagram of one embodiment of a laminated structure 100 and FIG. 1B is an isometric view 151 of the laminated structure showing upper 160 and lower 170 layers with vertical projections 175 defining tile subareas 161/171 and line sub-patterns 124/126.

FIG. 1A shows an embodiment of a laminated structure or organic substrate 115. The structure 115 has layers that form the electrical interconnections between a semiconductor chip 150 and other external electrical connections, for example a printed circuit board (PCB) 135. Note that FIG. 1A is for illustrative purposes and the intent is not to show any functioning electrical connections that would be necessary to create a functioning electrical structure.

The chip 150 has a plurality of Controlled Collapse Chip Connections (C4) ball type connections 112, that, in a preferred embodiment connect to an electrical connection array, e.g. a Ball Grid Array (BGA), not shown, on one of the top layers 140 of the organic substrate 115 to form an electrical and mechanical connection. Internally, the organic substrate 115 is made up of a core material (400-800 um) or coreless with layers of copper and resin sandwiched on both sides. In-plane electrical connections (sub-patterns) 124/126 are etched on individual copper layer and vias 136 provide connections between layers 160/170. The layers on top of the core are denoted as (FC) upper layers 160 and layers below the core as (BC) lower layers 170.

The upper layers 160 and the lower layers 170 in FIG. 1B have patterns (sub-patterns) of electrical connections 124/126 on some of the layer surfaces and/or connections passing through the layers, as vias, for example 136. The organic substrate 115 serves as vehicle to fan-out electrical connections between one or more chips 150 and the external connections, e.g. the PCB 135 and may contain passive electrical components as well.

In some embodiments, the laminated structure 100 has a flat reference plane 120 and the plurality of flat upper layers 160 and lower layers 170 are parallel to the flat reference plane. In many preferred embodiments, the flat reference plane 120, also referred to as a core 120, is a made of a stiff material that gives rigidity and flatness to the laminated structure and the layers (160, 170) and provides for vias, electrical pathways to make connections between the upper 160 and lower 170 layers. Typically, the core 120 is between 400-800 um. However, sometimes the core thickness is reduced to make drilling of via pathways through the core easier during manufacturing. In some embodiments, the core thickness can be reduced to 100-200 um and perhaps the core 120 can be eliminated, i.e., reducing the core 120 location to a non-physical reference plane 120. In laminated structures that have a physical core 120, the reference plane is considered as plane passing through core center and being parallel to the top and bottom of the core. Cores 120 are made of various stiff materials, including for example: porous silicon carbide, ceramics, or organic material strengthened with glass fiber.

The layers (160, 170) are typically planes of non-conductive material 110, e.g. organic materials, resin, and polymers with conductive material 130 patterned and disposed on the surface of the non-conductive material 110. The conductive material 130 (sub-patterns) make electrical connections and, as described below, can change the physical behavior (e.g. warp) of the layer on which the sub-patterns of conductive material are disposed. Other materials can be disposed on the surface of the non-conductive material 110, e.g. to make passive elements like capacitors. Conductive material includes copper (Cu), silver, gold, aluminum, tungsten, any other metallic material.

The bottom layer (one of the lower layers 170) establishes contact between the chip(s) 112 and laminated structure layers and the external world, e.g. PCB 135, through electrical connections 114. In a preferred embodiment these are C4 connections 114, although these C4 connections 114 can be of larger dimension than the C4 connections 112 connected to the chip 120.

The layers (160, 170) and core 120 are mechanically connected at their adjacent surfaces by adhesive or other means so the laminated structure has strength and behaves as a single mechanical unit. However, the physical connection of surfaces with different materials (or different combinations of materials) causes problems when the laminated structure experiences increases, decreases, or cycling of temperature during manufacturing and/or operation. These problems increase as the area of the laminated structure increases, particularly with the surface dimensions of the laminated structure being above 40×40 millimeters (mm), and worse with surface dimensions above 70×70 mm.

One problem caused by changes in temperature is warpage. Warpage or bending occurs when two layers expand unequally, but are bonded together, causing a natural tendency for the composition to bend. Therefore, the layers (160, 170) of the laminated structure 100 will bend with thermal changes because the conductive material 130 and non-conductive material 110 expand at different rates due to temperature because they have different Coefficients of Thermal Expansion (CTE.) Another factor in the amount of bending of a layer with dissimilar materials is the Young's Modulus of each of the materials. The Young's Modulus, E, determines the amount of deformation of a material at a given force per area. Determination of the amount of bending is complex, depending on a number of factors: the CTE, E, the thicknesses of the materials, cross sectional area of the materials, moments of inertia, and temperature change, etc.

The warpage of the single layer is driven by the coefficient of thermal expansion (CTE) mismatch between Cu (above) and the resin (below) in the layer. To complicate the problem still further, the layers that are bending non-uniformly are attached to other layers (and/or the core) that are also bending non-uniformly in different ways.

Difficulty in determining the bending effects of thermal stress in laminated structures 100 has prevented optimum thermomechanical design of these structures 100. Further, non-optimum thermomechanical design results in laminated structures 100 that have cores 120 that need to be thicker to stiffen the structure and that are more prone to delamination and electrical disconnection failures.

To further illustrate, the substrate 100 warpage is driven by the coefficient of thermal expansion (CTE) mismatch between upper layers 160 and lower layers 170. Assume, as an example, the upper layers 160 have a higher CTE than the lower layers 170. During manufacturing, the layers 160/170 are laminated together at about 125° C. After the layers 160/170 cool down to room temperature, the upper layers 160 shrink differently than the lower layers 170, resulting in warpage of the substrate, in a non-uniform way that is difficult to predict.

Refer to FIG. 1A. In this figure, a vertical projection 175 is taken through the laminated substrate 100. The vertical projection 175 divides the layers 160/170 into one or more tile subareas 161/171. The number of tile subareas 161/171 per layer may vary by design. Each tile subarea will contain a subset of the pattern of conductive material 130 disposed on the respective layer as a sub-pattern(s) 124/126. Depending on the positioning of the sub-pattern 124/126, there will be none, some, or all, of the conductive material of the respective layer 160/170 in a given tile subarea. Sub-patterns on upper layers 160 are upper sub-patterns 124. Sub-patterns on lower layers 170 are lower sub-patterns 126.

The metal, e.g. copper, making the upper and lower sub-patterns 124/126 has a higher CTE than the resin to which it is attached. As a result, if the metal is attached to the resin at a high temperature, the structure tends to warp with the metal layer shrinking more than the resin as the structure cools. The structure warps into a concave shape with the metal layer forming the "open side". The invention minimized the difference in warp between the upper and lower layers in corresponding layer pairs.

Figure 2:
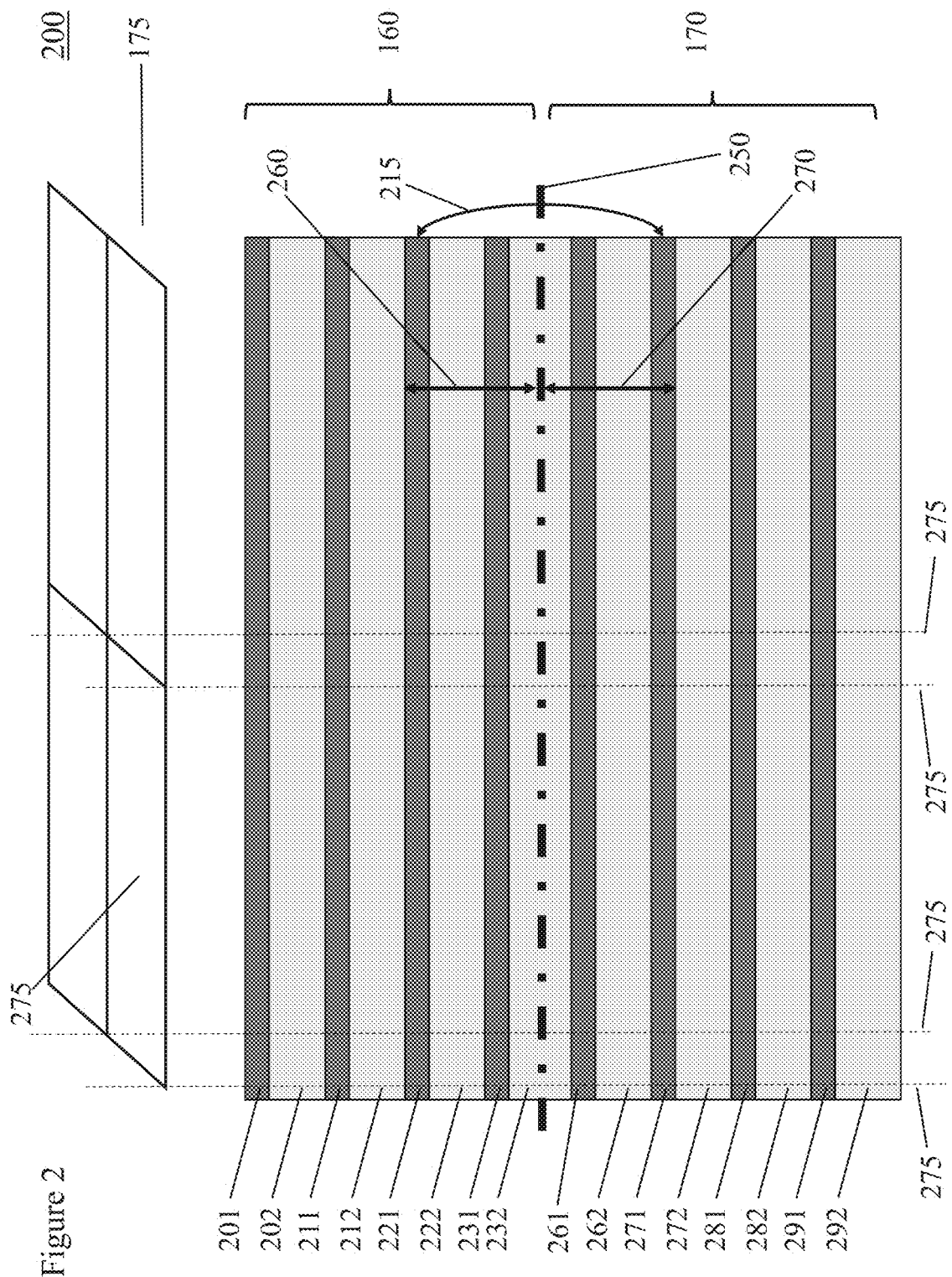
FIG. 2 is a view of an upper and lower layers and tile subarea defined by vertical projections and an example pair of corresponding upper (FC) and lower (BC) layers (a corresponding layer pair) and accordingly corresponding tile subareas in the corresponding layer pair.

FIG. 2 is a view of a structure 200 with upper 160 and lower 170 layers and tile subareas (not shown in this view) 161/171 defined by vertical projections 175/275 and an example pair of corresponding upper 160 and lower 170 layers (corresponding layer pair) 215 and accordingly corresponding upper 161 and lower 171 tile subareas in the correspond layer pair 215.

Pairs of tile subareas 161/171 in the corresponding layer pair 215 that are within one given vertical projection 175/275 are a corresponding pair of tile subareas.

In the structure 200, a layer contains conductive metal sub-patterns on a non-conductive surface. Metallic sub-patterns 201/211/221/231 on non-conductive material, like resin, 202/212/222/232 are interleaved to form the layers, for example, layer 201/202, layer 211/212, etc.

The upper layers 160 are divided into one or more upper tile subareas 161 as delimited by the vertical projections 275 defined by the vertical projection window 175/275. One or more of the upper tile subareas 161 of the metal pattern-containing upper layers has one or more metal upper sub-patterns 124, described in more detail below, that perform functions, e.g. electrical circuit functions, of the structure 200.

The layers 261/262, 271/272, 281/282, etc. below the reference plane 250 are lower layers 170. As before, the lower layers 170 are divided into one or more lower tile subareas 171 as delimited by the same vertical projections 275 defined by the vertical projection window 175/275. One or more of the lower tile subareas 171 of the metal pattern-containing upper layers has one or more metal lower sub-patterns 126, described in more detail below, that perform functions, e.g. electrical circuit functions, of the structure 200.

An example corresponding layer pair 215 is shown. Typically, a corresponding layer pair 215 has one metal pattern-containing upper layer 160 and one metal pattern-containing lower layer 170. In some embodiments, the selected metal pattern-containing upper layer 160 and the metal pattern-containing lower layer 170 in the corresponding layer pair 215 has a similar affect on the warping of the structure 115. In some embodiments, the selected layers 160/170 in the corresponding layer pair 215 are selected because the selected upper layer 160 is a upper distance 260 from the reference plane 250 and the selected lower layer 170 is a lower distance 270 from the reference plane 250, where the upper 260 and lower 270 distances are equal. For instance, selected metal pattern-containing upper layer 160 and the metal pattern-containing lower layer 170 in the corresponding layer pair 215 are symmetrical about reference 250.

The upper tile subareas 161 in the selected upper layer 160 and the lower tile subareas 171 in the selected lower layers 170 are in the same delimiting projections 175/275. As a result, in each corresponding layer pair 215 there are one or more upper tile subareas 161 (and upper sub-patterns 124) in the upper layer 160 that correspond respectively to a unique lower tile subarea 171 (and lower sub-patterns 126) in the lower layer 170 of the corresponding layer pair 215. In each corresponding layer pair 215, each of the pairs of corresponding upper tile subareas 161 and corresponding lower tile subareas 171 is called a corresponding tile subarea, described in more detail below. In some embodiments, the tile subareas in each corresponding tile subareas are also equidistant from 260/270 and symmetric about the reference plane 250.

In alternate embodiments, the upper tile subarea(s) 161 can be an aggregate of tile subareas in two or more selected upper layers 160 and treated as one upper tile subarea 161. Also, the lower tile subarea 171 can be an aggregate of tile subareas in two or more selected lower layers 170 and treated as on lower tile subarea 171.

Generally, each of the upper 161 and lower 171 tile subareas in the upper 160 and lower 170 metal pattern-containing layers have initial/original upper 124 and lower 126 metal sub-patterns that are different from one another.

The length L, width W, depth, material type, orientation, moment of inertia, etc. of each metal sub-pattern determine how the particular metal sub-pattern affects the bending behavior of the respective corresponding tile subareas 161/171 during thermal changes/stress. Therefore, all the metal shapes in a given tile subarea, i.e. the line sub-patterns 124/126, in aggregate affect the bending behavior of each of the tile subareas in the corresponding tile subareas 161/171, respectively. These affects change as the amount of conductive material in the line sub-pattern 124/126 changes as a percentage (by volume and/or mass, or area) of the non-conductive material making up the composite structure of the tile subarea.

In some embodiments, the depth of the conductive material is considered uniform and constant across each sub-pattern area 124/126, all tile subareas 161/171, and layers 160/170. Also, in some embodiments, the depth of the non-conductive material is considered uniform and constant across all tile subareas 161/171 and layers 160/170. These embodiments are useful for laminated structures 100 that are made in a layering process where materials are layered with uniform thickness before being patterned.

Figure 3:
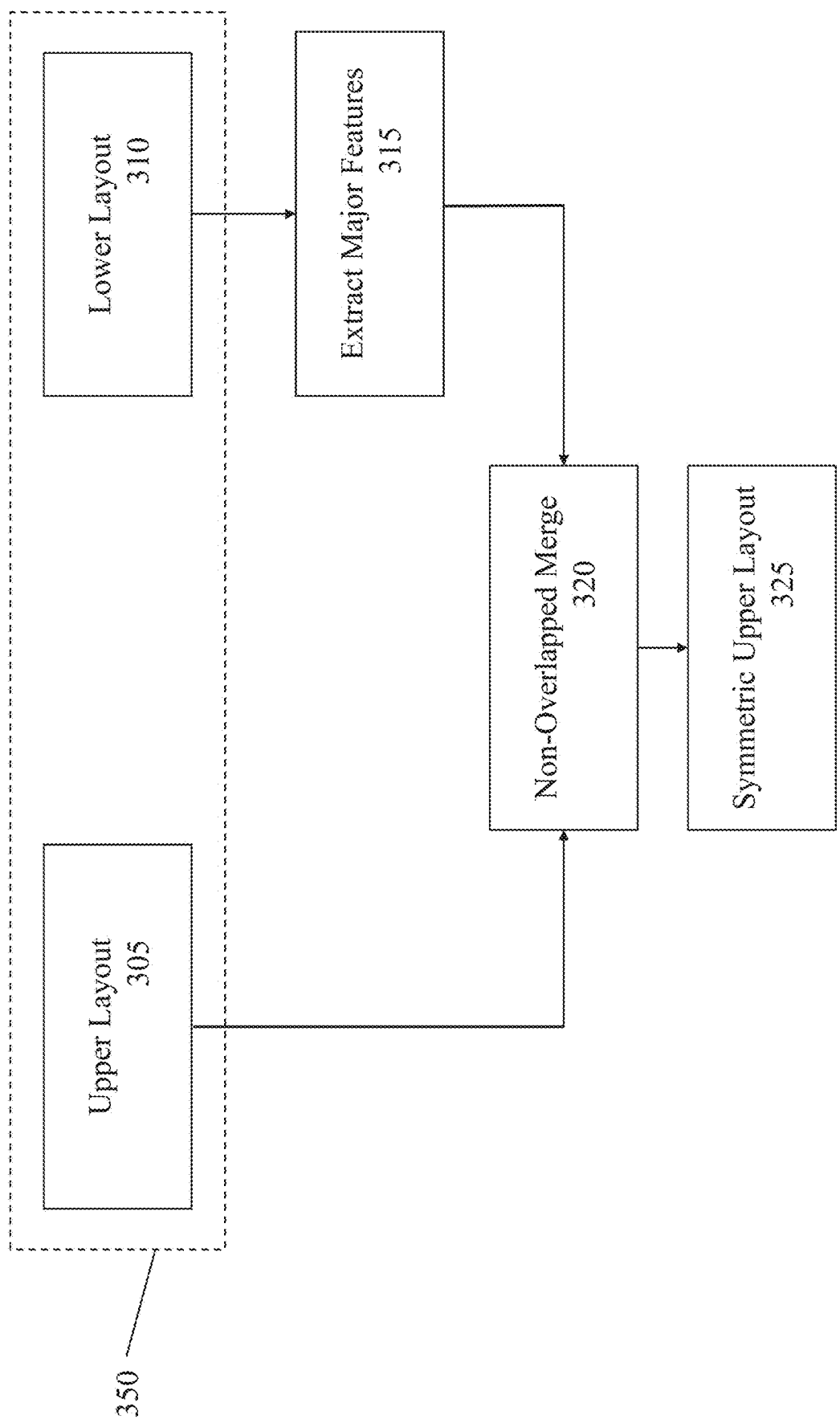
FIG. 3 is flow chart of symmetric upper layout process for creating a symmetric upper layout on the upper layer of a corresponding layer pair.

FIG. 3 is flow chart of symmetric upper layout process 300 for creating a symmetric upper layout 325 on an example upper layer 160 in a corresponding layer pair 215.

The symmetric upper layout process 300 begins with an original 350 representation (bitmap or otherwise) of an original upper layout 305 and an original lower layout 310 in one or more of the corresponding layer pairs 215. The original upper layout 305 can be a representation of the entire upper layer 160 or one or more of the tile subareas 161 ultimately aggregated to form the original upper layout/layer 160. In like manner, the original lower layer 310 can be a representation of the entire lower layout/layer 170 in the corresponding layer pair 215 or one or more of the tile subareas 171 ultimately aggregated to form the original lower layout 170. In some cases where one or more tile subareas 161/171 are chosen, the process iterates until all the tile subareas 161/171 are processed and integrated to form a complete symmetric upper layer 325.

The major features of the lower layout 310 are extracted 315 as described in more detail below.

The extracted "lower" major features 315 from the lower layout 310 are merged 320 with the original upper layer 305. Generally, the merging 320 is a "non-overlapped" merge. In some embodiments, the non-overlapped merge is a logical intersection of the upper layout 305 and the lower major features 315. In other words, extracted major features 315 from the lower layout 310 are added to/intersected with all the features in the upper layout 305 where there is no overlap with upper layer 305 features to form the symmetric upper layout 325.

This is one general overview of the process 300. Specific and/or alternative embodiments are discussed below.

Figure 4:
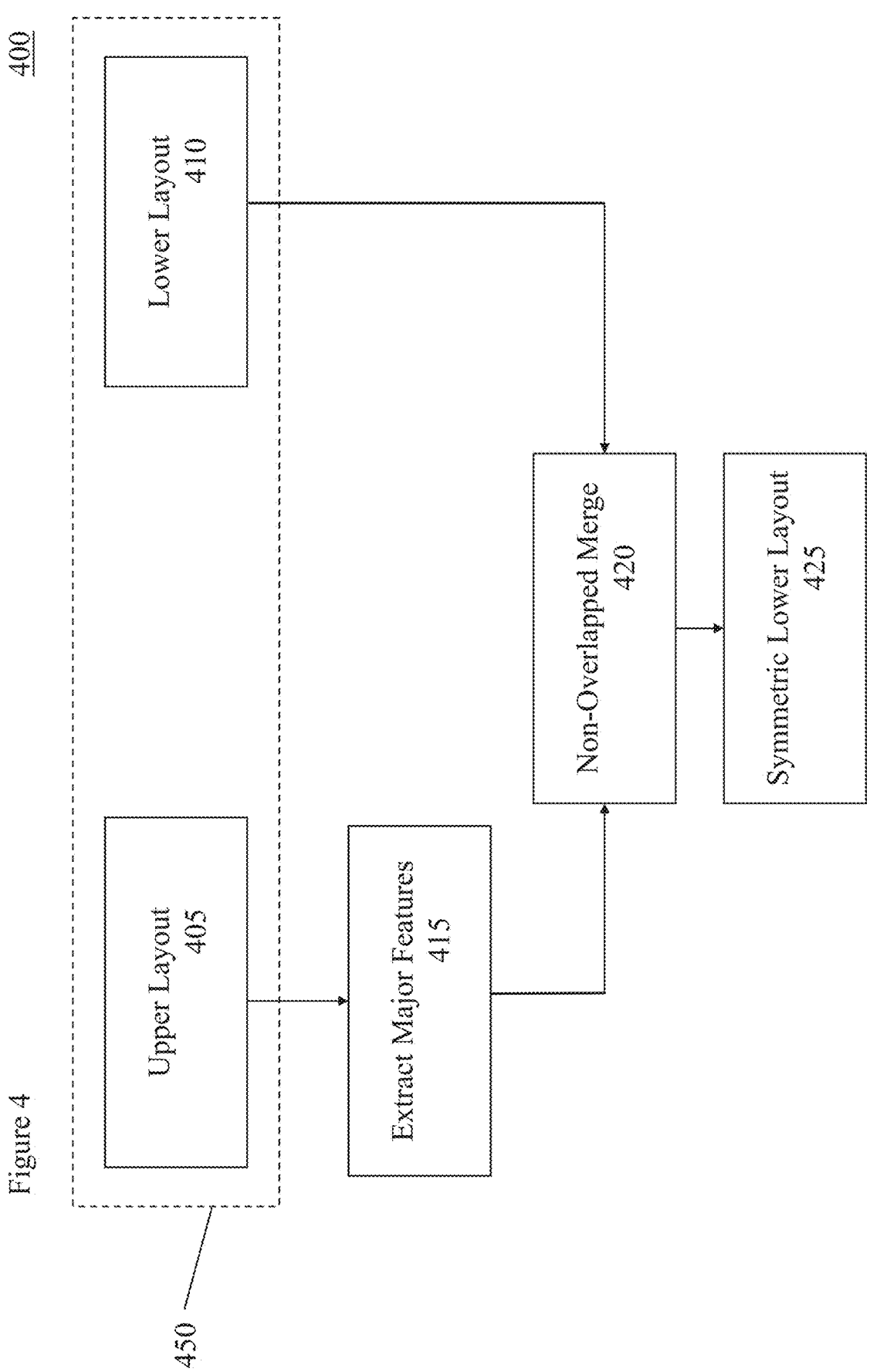
FIG. 4 is flow chart of symmetric lower layout process for creating a symmetric lower layout on the lower layer of a corresponding layer pair.

FIG. 4 is flow chart of symmetric lower layout process 400 for creating a symmetric lower layout 425 on the lower layer 170 of the corresponding layer pair 215 being processed.

The symmetric upper layout process 400 begins with an original 350/450 representation (bitmap or otherwise) of the original upper layout/layer 305/405 and the original lower layout/layer 310/410 in one or more of the respective corresponding layer pairs 215 being processed. The original upper layer 305/405 can be a representation of the entire upper layout/layer 160 or one or more of the tile subareas 161 in the original upper layer 160. In like manner, the original lower layer 310/410 can be a representation of the entire lower layer 170 in the corresponding layer pair 215 or one or more of the respective (in the same projection 175) tile subareas 171 in the original lower layer 170. In some cases where one or more tile subareas 171 are chosen, the process iterates until all the tile subareas 171 are processed and integrated to form a complete symmetric lower layer 425.

The major features of the upper layout 310/410 are extracted 415.

The extracted "upper" layout 305/405 features 415 from the upper layout 305/405 are merged 420 with the original lower layout 310/410. As before, the merging 420 in generally is a "non-overlapped" merge 420. In some embodiments, the non-overlapped merge 420 is a logical intersection of the lower layout 310/410 and the upper major features 415. In other words, extracted major features 415 from the upper layout 305/405 are added to the lower layer 310/410 where there is no overlap with lower layer 310/410 features to form the symmetric lower layout 425.

The processes 300/400 can be repeated for one or more corresponding layer pair 215 to modify each of the corresponding layer pairs 215 into a symmetric layer pair 325/425 made of respective symmetric upper 325 and lower 425 layout.

One or more of the symmetric layer pairs 325/425 can be further processed as described below. In addition, alternative process steps and structures for creating the symmetric layer pairs 325/425 are disclosed below, e.g. in the layout-symmetric embodiments.

Figure 5:
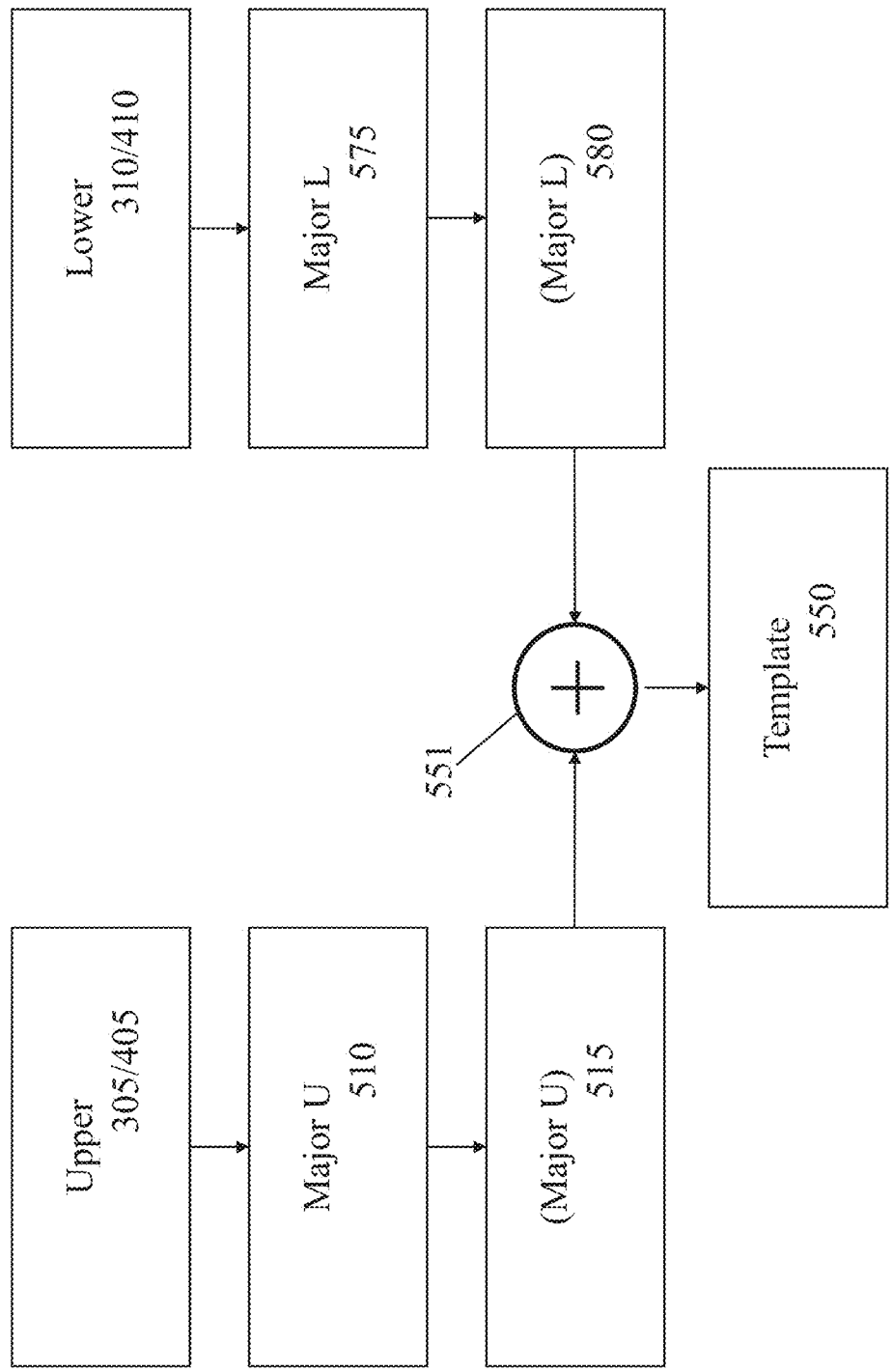
FIG. 5 is a flow chart of a template process for designing a template used in creating symmetric upper and lower layouts in a corresponding layer pair that are electrically equivalent to an original non-symmetric design.

FIG. 5 is a flow chart of a template process 500 for designing a template 550 useful for creating symmetric layer pairs 325/425 from one or more original corresponding layer pairs. The created symmetric layer pairs 325/425 need to be electrically equivalent to the original, non-symmetric designs 305/405/310/410 but with a higher thermomechanical symmetry to reduce warp.

The template process 500 begins with the original upper layout 305/405 and lower layout 310/410. Major features are extracted 510 from the original upper layout 305/405. Major features are extracted 575 from the original lower layout 310/410. In some embodiments, major features are extracted/selected 510/575 from the upper 124/510 and lower 126/575 metal sub-patterns, respectively. More detail about feature extraction 510/575 is disclosed below.

Borders (e.g. "Major U") are formed 515 around the extracted upper major features 510 to create enhanced upper major features 515. Borders (e.g. "Major L") are formed 580 around the extracted lower major features 575 to create enhanced lower major features 580.

In step 550 of the template process 500 a template is formed 550 by merging 551 the enhanced upper major features 515 with the enhanced lower major features 580. In other words, the template 550 is a logical intersection or a combination 551 of the enhanced upper major features 515 and the enhanced lower major features 580.

As before, the template process 500 can be performed on one or more upper 161 and lower 171 tile subareas 161/171 in the respective original upper 160 and lower 170 layers and the results extracted 510/575, enhanced 515/580, combined 551 and integrated to create the template 550. Further, the process 500 can be repeated for one or more original corresponding layer pairs to create a template 550 for of the corresponding layer pairs 215 for some or all of the organic substrate 115.

Figure 6:
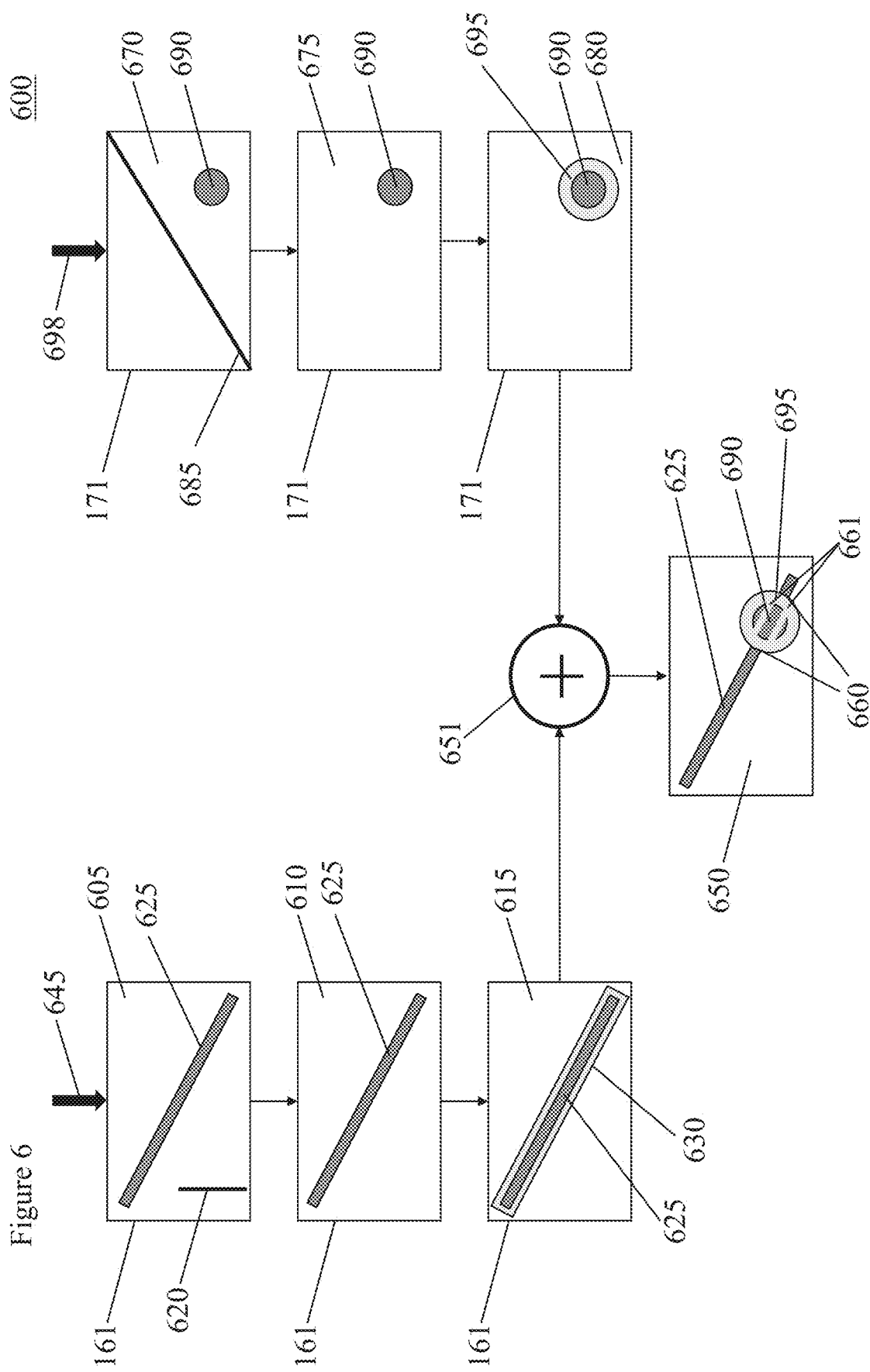
FIG. 6 is a flow diagram showing an example template process.

FIG. 6 is a flow diagram showing an example template process 600 to further illustrate the how a template 550/650 is created.

The steps beginning at point 645 process the upper layer(s) 160 and the steps beginning at point 698 process the lower layer(s) 170 in each of the corresponding layer pairs 215 (and/or one or more of the subareas 161/171 in each of the corresponding layer pairs 215).

Step/structure 605 shows one or more sub-pattern areas 124/620/625 in one original tile subareas 161 of one or more of the original tile subareas 161 of the original upper layer 305/405 of one of the corresponding layer pairs 215.

In this example, the original upper tile subareas 161 include a thin line sub-pattern area 620 and a thick line sub-pattern area 625.

Step/structure 610 shows the major feature selection 510/610 of the sub-pattern areas 124/620/625 in the original tile subarea 605. Major feature selection 510/610 can be performed in many ways depending on: the geometries of the sub-pattern areas 124/620/625, whether the tile subarea is upper or lower, the process used (e.g. bitmap-symmetric embodiment or the layout-symmetric embodiment), etc. In this non-limiting example, a line is selected as a major feature if the line width of the line is greater than a threshold line width. Here, line 625 has a linewidth greater than the threshold line width and is selected to remain in step/structure 610 as an extracted major feature 510/610. Line 620 has a linewidth less than the threshold line width and is de-selected and removed from the step/structure 610. Other selection/de-selection methods are envisioned.

In step/structure 615, the selected major features (e.g. line 625) in the step 610 are enhanced to become enhanced major features (e.g. enhanced major feature 625/630). In some embodiments, the enhanced major feature 625/630 are the (extracted) major feature 625 with a border 630 placed around. For example, known image processing techniques can be used to add a border 630 around the extracted major feature 625. The border can have a border thickness defined by one or more rules governing the image processing. The major features 625 and borders 630 can be represented as patterns in a bitmap.

Beginning at point 698, one of the subareas 171 of one or more of the subareas 171 of the lower layer 170 in one of each of the original corresponding layer pairs 215 is processed The original bottom tile subarea 670 has a different sub-pattern area 171 than the sub-pattern 161 areas in top original tile 605. The original bottom tile subarea 171/670 has diagonal line 685 and a circle 690 lower sub-patterns 126.

Step/structure 675 shows the major feature selection 510/610 of the lower sub-pattern areas 126/685/690 in the original bottom tile subarea 670. As before, the major lower feature extraction 575/675 can be performed in many ways. In this non-limiting example, a diagonal line 685 is de-selected as a major feature because the diagonal line 685 linewidth is less than a threshold line width. On the other hand, the circle sub-pattern area 690 is extracted as a major lower feature 675 because the diameter of the circle 690 is greater than a threshold diameter. Again, other extraction/de-selection methods are envisioned.

In step/structure 680, the extracted lower major feature (e.g. circle 690) in the step 675 is enhanced to become enhanced 680 lower major feature (e.g. an enhanced circle 690/695). In this embodiment, the enhanced circle 690/695 is the selected circle 690 with a border 695 placed around. The border can have a border thickness defined by one or more rules governing the image processing creating the border 695. In some embodiments, the enhanced lower major feature 690/695 can be represented by a bitmap.

The enhanced upper major features 625/630 and the enhanced lower major features 690/695 are combined 651 to create the template 550/650.

In some embodiments, the combination 651 is a logical intersection 651 of the enhanced lower major feature(s), e.g. 690/695, the enhanced upper major feature(s), e.g. 625/630.

The template 650/550 is formed by this intersection 651.

In some embodiments, where the borders 630/695 intersect/overlay a major feature 625/690, e.g. a metal/copper region, the major feature portion overlaid/intersecting the border is removed. For example, where the border 695 of the circle 690 intersects the line 625, line gaps 660 in the line 625 form on either side of the circle 690. In addition, where the line border 630 intersects the circle 690, cord gaps 661 form, removing material, e.g. copper, on cords 661 of the circle 690.

In the bitmap-symmetric embodiment, the template 550/650 and the steps in process 600 can take the form of bitmaps that are manipulated by image processing techniques. Uses of the templates 550/650 created by the bitmap-symmetric embodiment are described in more detail below.

In the layout-symmetric embodiment, other methods of creating the gaps 660/661 are used, as described below.

Figure 7A:
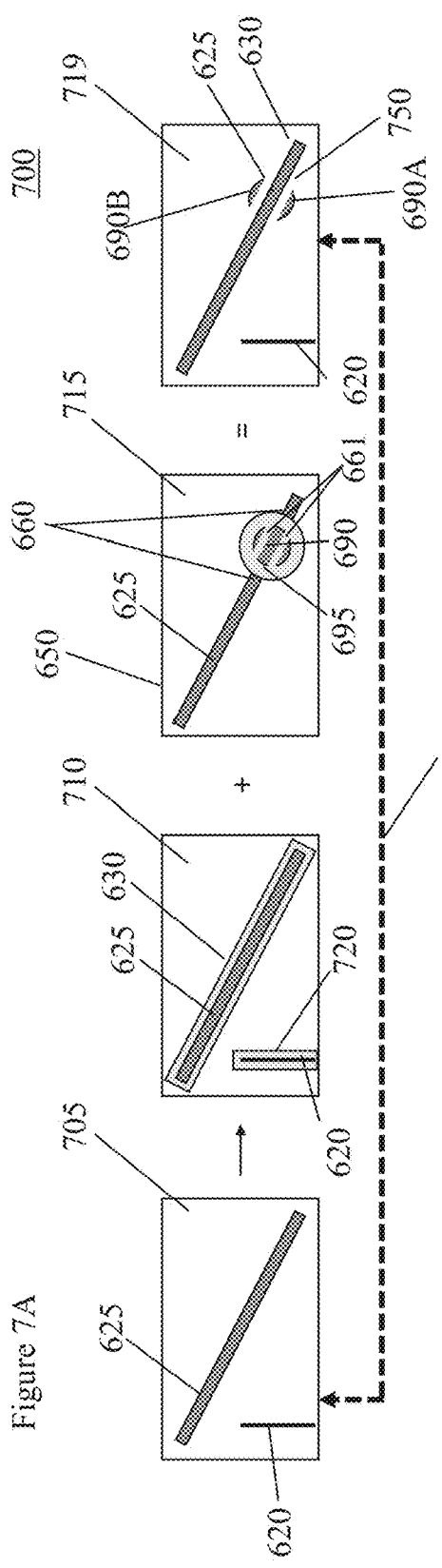
FIG. 7A is a flow diagram using a template to design a symmetric upper layout (and/or one or more symmetric tile subareas) in a corresponding layer pair using a bitmap-symmetric embodiment.

FIG. 7A is a flow diagram of a process 700 using a template, e.g. 550/650, to design a symmetric upper layout 325/719 (and/or one or more upper tile subareas 161) in a corresponding layer pair 215 using a bitmap-symmetric embodiment.

In step 705, the process 700 begins with the original tile subarea 161 of the original upper layer 305/405/605/705 of one of the corresponding layer pairs 215.

In step 710 of the process 700, all the features in the original upper layer 705 are enhanced 710. In some enhancing embodiments, a border is placed around the features 620/625. For example, a border 720 is placed around line 620 and a border 730 is placed around line 625. In this embodiment, borders are used to ensure the enhanced features (e.g. with borders) remain intact in the symmetric upper layer 719.

In step 715, the template 550/650 is logically intersected with the enhanced original upper layer features 710. As a result, any gaps in or missing conductive material, e.g. copper, in the template 550/650 that intersect with the enhanced original upper layer features 710, result in a complete upper layer 705 feature, e.g. 620/625 in the symmetric upper layout 719/325. This ensures that all electrical connections that are made in the original upper layer 705, are also made in the symmetric upper layout 719/325. In other words, the symmetric upper layout 719/325 will be electrically equivalent 762 to the original upper layer 705.

In addition, the features, e.g. 620/625 of the original upper layer 705 will be present in the symmetric upper layout 719/325. Therefore, the contribution of these features 620/625 to the warp of the organic substrate 100 will be the same in the symmetric upper layout 719/325 as they are in the original upper layer 705.

However, the symmetric upper layout 719/325 will also have additional features and/or portions of lower feature portions 690A/690B that are present in the original lower layer 775 that are not redundant with the features and the original upper layer 705 and that do not interfere (and may not participate) with the electrical operation of the symmetric upper layout 325/719. These lower feature portions 690A/690B make the symmetric upper layout 325/719 more thermo-mechanically and geometrically symmetric with the symmetric lower layout 425/790. These lower feature portions 690A/690B may have no electrical function in the symmetric upper layout 719/325.

Using process 700, the symmetric upper layout 325/719 is electrically equivalent to the original upper layer 705 and thermo-mechanically and geometrically more symmetric with respect to the thermal expansion parameters of the symmetric lower layer 425/790 made by process 750.

Figure 7B:
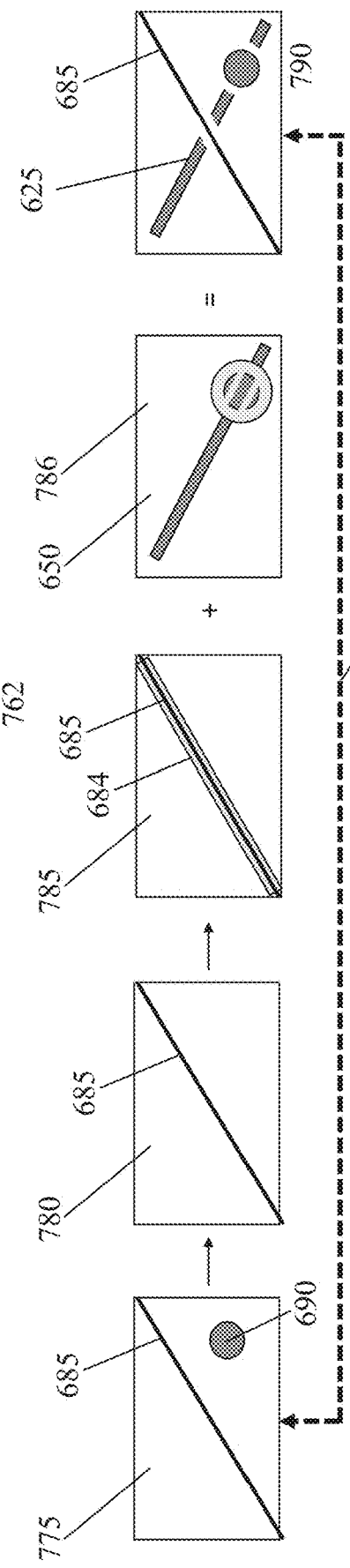
FIG. 7B is a flow diagram using the template to design a symmetric lower layout (and/or one or more symmetric tile subareas) in a corresponding layer pair using a bitmap-symmetric embodiment.

FIG. 7B is a flow diagram of a process 750 using the template 550/560 to design a symmetric lower layout 425/790 (and/or one or more lower tile subareas 171) in a corresponding layer pair 215 in a bitmap-symmetric embodiment.

In one embodiment, not shown, the process 750 can repeat the steps of the process 700 for the lower layout 310/410/670/775 features 685/690.

In an alternative embodiment, in step 780, the minor features 685 are extracted from the lower layout 310/410/670/775 and the major features, e.g. 690, are de-selected. For example, the lower feature (e.g. sub-pattern 126), circle 690, has a diameter above a threshold diameter, is determined as a major lower feature, and de-selected. Line 126/685 is determined to have a linewidth below a threshold linewidth, is determined to be minor lower feature, and is extracted.

In step 785, the extracted minor lower features, e.g. 685, are enhanced, e.g. by adding a border 684 around the extracted minor feature(s) 685.

In step 786, the extracted 780 and enhanced 785 lower minor features, e.g. 684/685, intersect with the template 550/650 to form the symmetric lower layout 425/790. Because the major lower features, e.g. 690 are (generally) are preserved in the template 650 and the minor lower features, e.g. line 685, are enhanced and added/intersected to form the symmetric lower layout 425/790, the symmetric lower layer 425/790 is electrically equivalent 764 to the original lower layout 310/410/670/775.

Note that during the template process 500/600, the enhanced borders prevent the sub-patterns 124/126 from overlapping when the merger 551/651 creates the template 550/650. The template 550/650 contains non-overlapping (non-redundant) information about the major features in both the original upper 161 and lower 171 tile subareas. In process 700, combining the all the features in the original upper layer 705 creates an electrically equivalent 762 symmetric upper layer 325/719 while adding most of the lower major features from the template makes the symmetric upper layer 325/719 more thermo-mechanically symmetrical. In addition, in process 750 the template 550/650 includes the upper major feature(s) 625 for thermomechanical symmetry and (most of) the lower major features 690 which when added to the enhanced lower minor features 785 to make the symmetric lower layout 425/790 electrically complete 764 (except for the cord gaps 661).

Accordingly, the symmetric lower layer 425/790 created is electrically equivalent 764 to the original lower layout 310/410/670/775 and has a geometric and mechanical symmetry to the symmetric upper layout 325/719 because of the non-electrically functioning extracted major feature 625 is included as part of the template 650.

Note that in some embodiments, artifacts like cord gaps 661 of the circle 690, can destroy the electrical operation of the symmetric lower layer 425/790 and/or the electrically equivalence 764. (These artifacts can also occur in the symmetric upper layer 325/719.) When identified, these artifacts can be electrically corrected, as described below, without adversely effecting the mechanical and geometric symmetries to a large extent.

Figure 8:
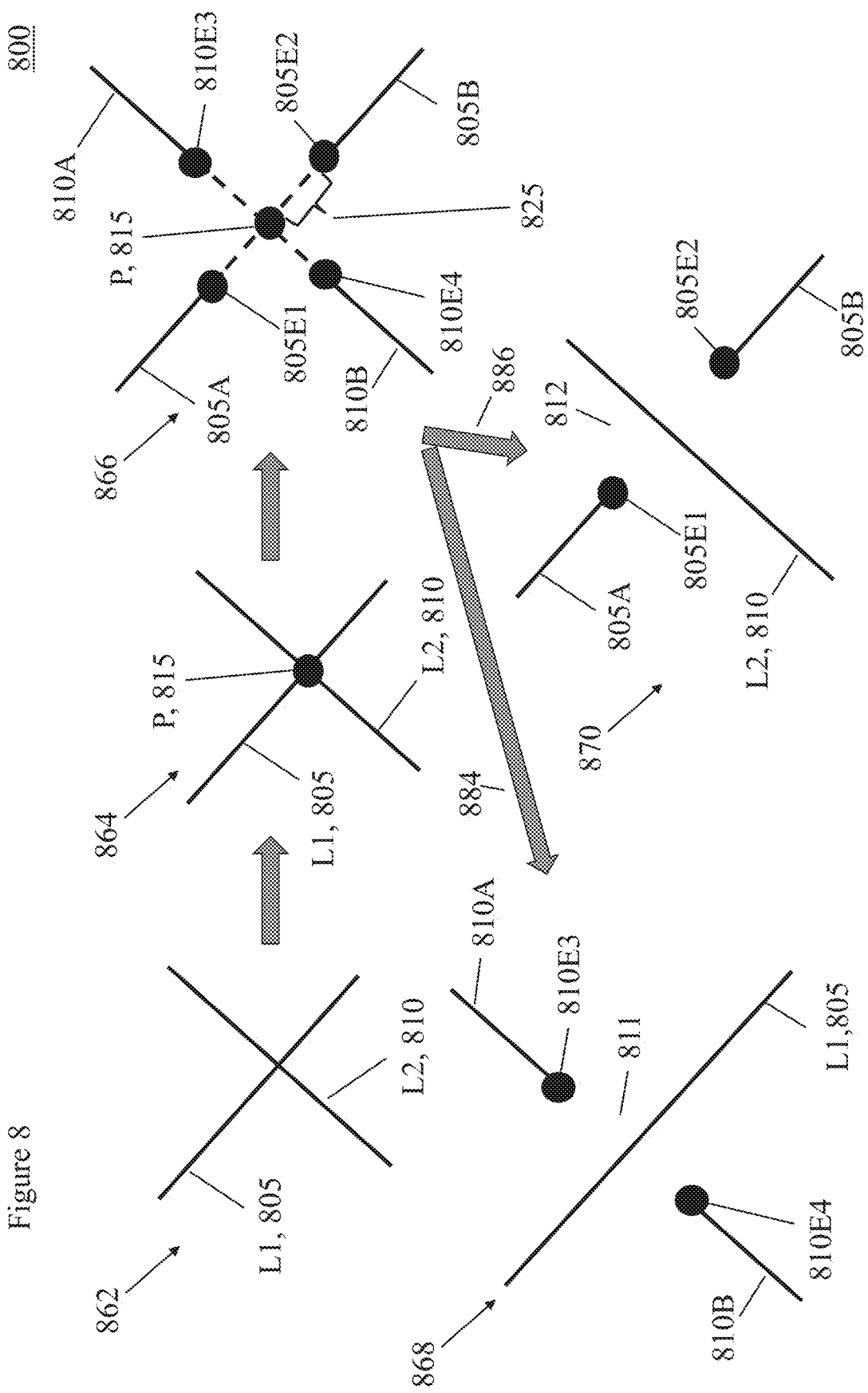
FIG. 8 is a sequence of configurations describing how intersecting lines are processed in a combined major feature structure to produce an electrically functioning and symmetric layer structure in a layout-symmetric embodiment.
Figure 9:
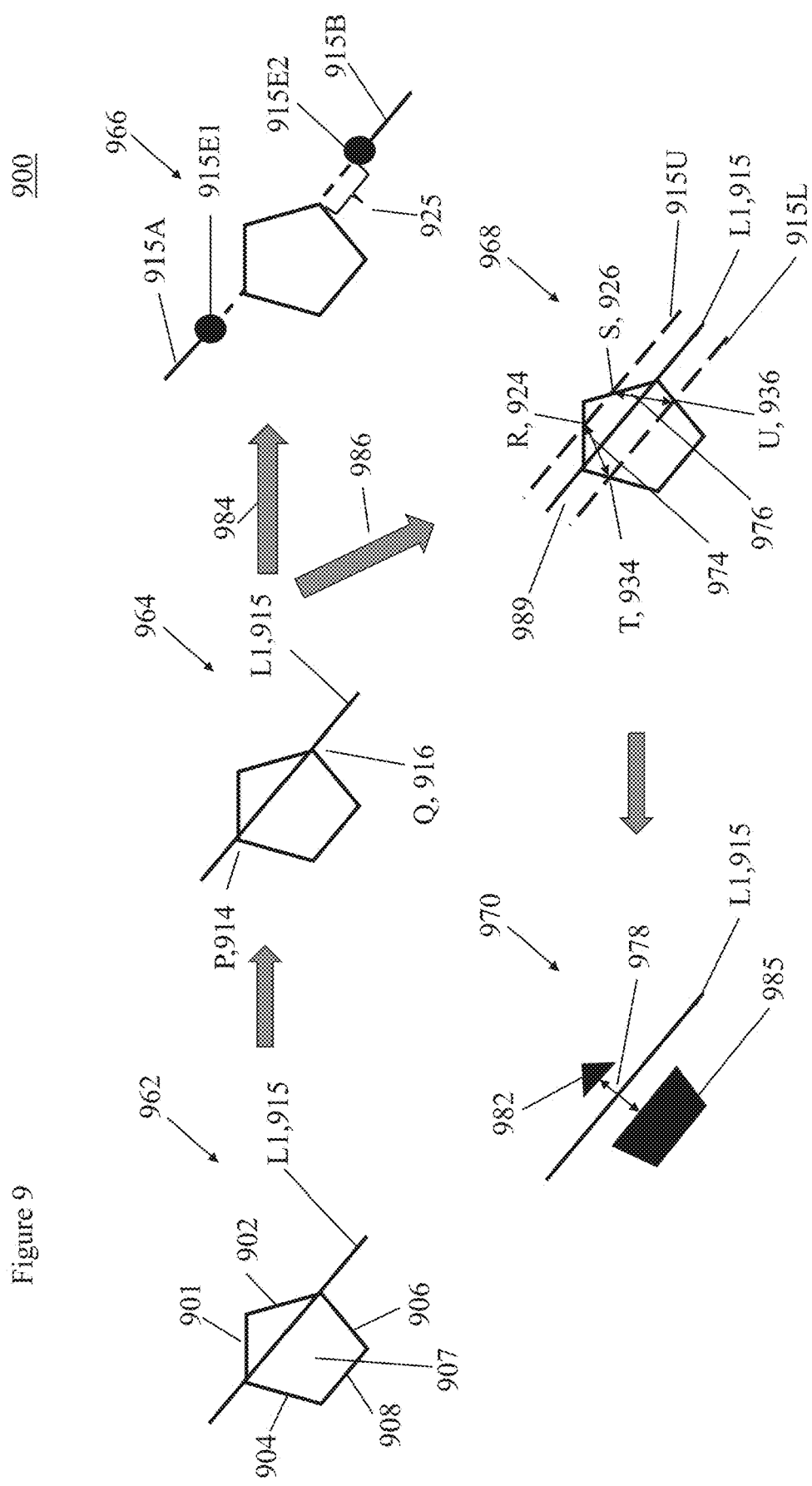
FIG. 9 is a sequence of configurations describing how a line intersecting with a general polygonal structure are processed in a combined major feature structure to produce an electrically functioning and symmetric layer structure in a layout-symmetric embodiment.

FIGS. 8, 9, and 10 describe alternative embodiments of creating symmetric upper 325/719 lower 425/790 layers using a layout-symmetric embodiment. In some cases, the layout-symmetric embodiment enables additional and/or easier testing of the symmetric upper 325/719 lower 425/790 layers. Three example cases are considered: a line merging with a line 800, line merging with a polygon 900, and a polygon merging with polygon 1000.

FIG. 8 is a sequence of configurations 862/864/866/868/870 describing how intersecting lines (L1, 805 and L2, 810) are processed 800 to combined major features to produce an electrically functioning 762/764 and symmetric layer structures 719/790 in a layout-symmetric embodiment.

Example 862 shows two lines to be enhanced 515/580 merged 551/651. For example a line L1 805 is an upper sub-pattern 124 in one or more upper tile subareas 161 in an original upper layer 305/405/605/705 and line L2 810 is a lower sub-pattern 126 in one or more lower tile subareas 171 in an original lower upper layer 310/410/670/775. In configuration 864, point P 815 is designated as the point 815 where line L1 805 and L2 810 intersect after the merge 651.

To complete the merge 651, four new endpoints 805E1, 805E2, 810E3, and 810E4 are created in configuration 866. A border size is determined. For example, the border size can be the width of the borders used above. In some embodiments, each of the four endpoints, is separated from point P 815 by a gap 825 of one-half the border size. Endpoints 805E1 and 805E2 are on line L1. Endpoints 810E3 and 810E4 are on line L2.

As shown in configuration 868, to create 884 the symmetric upper layout 325/719, line L1 805 must be kept intact to maintain electrical equivalence 762. Therefore, in configuration 868, endpoints 805E1 and 805E2 are removed and line L1 805 is made continuous. Endpoints 810E3 and 810E4 are maintained and line L2 810 remains two segments 810A/810B separated by a distance 811 equal to the border size.

As shown in configuration 870, to create 886 the symmetric lower layout 425/790, line L2 810 must be kept intact to maintain electrical equivalence 764. Therefore, in configuration 870, endpoints 810E3 and 810E4 are removed and line L2 810 is made continuous. Endpoints 805E1 and 805E2 are maintained and line L1 805 remains two segments 805A/805B separated by a distance 812 equal to the border size.

In some embodiments, variables like object size can determine the threshold size (e.g. linewidth, diameter, or polygon area) that govern whether a sub-pattern 124/126 is major or minor. A variable like border size determines the width/distance, e.g. 811/812 between merged sub-patterns 124/126. As shown above, sub-patterns 124/126 with a dimension(s) greater than an object size or threshold can be identified as major 510/575, enhanced 515/580, and merged 551. In some embodiments, the object size and border size can have different values for the upper 161 and lower 171 tile subareas.

As stated above, artifacts, e.g., electrical short or open circuits, in sub-patterns 124/126 like segmented power/ground planes can be electrically corrected later in the process. Alternatively, metallic patterns with small areas that do not substantially affect the thermal mechanical warp and are needed electrically can be protected and not disturbed by the processing.

FIG. 9 is a sequence of configurations 962/964/966/968/970 describing how one or more lines, e g. L1 915, intersecting with a general polygonal structure 907 are processed 900 to merge 551/651 major feature structures to produce an electrically functioning and symmetric layer structures 719/790 in a layout-symmetric embodiment.

In some embodiments, the line segments 901/902/904/906/908 of the polygon 907 shaped sub-pattern(s) 124/126 as shown in configuration 962.

In configuration 964, using known methods, the intersection points P 914 and Q 916 are determined where the line 915 intersects with the polygon 907 sub-pattern 124/126.

The polygon 907 size (e.g. used for identifying and extracting major features) can be determined by known method. For example, the polygon 907 line segments are drawn and a recursive search finds the farthest line segments to determine the size of the polygon. In some embodiments, the threshold area is 80 um. In alternative embodiments, since most polygons are greater than 100 um, all polygons are considered major and this determination is skipped.

If polygon 907 must remain intact (polygon dominant) 984, e.g. to retain electrical equivalence 762/764 of the layer 160/170, endpoints 915E1 and 915E2 are located on line 915 on either side of the intersection points 914 and Q 916 to create gaps 925 between the line 915 and the polygon 907, as shown in configuration 966. In some embodiments, the size of the gap 925 is governed by a border size variable. Accordingly, the line 915 is separated into two colinear line segments 915A and 915B with gaps 925 between each of the endpoints 915E1/915E2 and the polygon 907 sub-pattern 124/126.

If line 915 must remain intact (line dominant) 986 (as shown in configuration 968), e.g. to retain electrical equivalence 762/764 of the layer 160/170, four points R 924, S 926, T 934, and U 936 are determined to define lines 915L and 915U which are symmetric about and parallel to the line 915. Lines 915L and 915U intersect the polygon 907 creating a channel 989 with a channel width 978. The channel width 978 can be determined by a border size variable.

As shown in configuration 970, the channel 989 splits the polygon 907 and line R-S and T-U become sides of two split polygons 982/985, the resulting intersection of the sub-patterns 124/126.

FIG. 10 is a sequence of configurations 1010/1020/1030/1040 describing how a two general, polygonal, intersecting structures 1004/1006 are processed to merge 551/651 to make major feature structures that are electrically functioning and thermo-mechanically symmetric.

In configuration 1010, a first 1004 and second 1006 polygon are identified as intersecting.

All line segments of each polygon 1004/1006 are identified and put in a list. Next, each line segment of polygon 1004 is tested for possible intersection with line segments of polygon 1006. In this example and in configuration 1020, the polygons intersect each other at point P 1001 and Q 1009.

If the case 1060/1065 is that polygon 1006 must be kept intact (is dominant) to produce an electrically functioning and symmetric layer structures 719/790 in a layout-symmetric embodiment, then lines L1 1036 and L2 1038 are drawn parallel to the intersected line segments S1 1037 and S2 1039, respectively, as shown in configuration 1030. These lines L1 and L2 are drawn a border distance from the respective polygon 1006 line segments S1 and S2. In this case 1060 the material, e.g. copper, is removed from polygon 1034 where there is an overlap of the polygons 1034/1006 and the region between polygon 1006 and the lines L1 1036 and L2 1038.

The configuration 1040 shows the resulting polygon 1044 with a gap 1045 created between the two polygons 1006/1044. Again, the gap width can be determined by a setting a border size variable. There is no overlap between polygon 1006 and new polygon 1044. The electrical equivalence 762/764 is maintained (polygon 1006 is intact) while the mechanical surface of polygon 1044 is added to the layer to make the organic substrate 115 more symmetrical.

Alternatively, if polygon 1004 is dominant (required to stay intact), the technique is repeated with polygons 1004 and 1006 reversing roles. Further, the technique can be repeated if there are more intersections between polygons.

Organic substrate 115 manufacturers can create the symmetric upper layout 325 and symmetric lower layout 425 in multiple ways, e/g/ by using for example the Bitmap-Symmetric embodiment 1100, the Layout-Symmetric method 1200, and their variations. Selection of manufacturing options can depend on available resources, level of know-how, etc.

Figure 11:
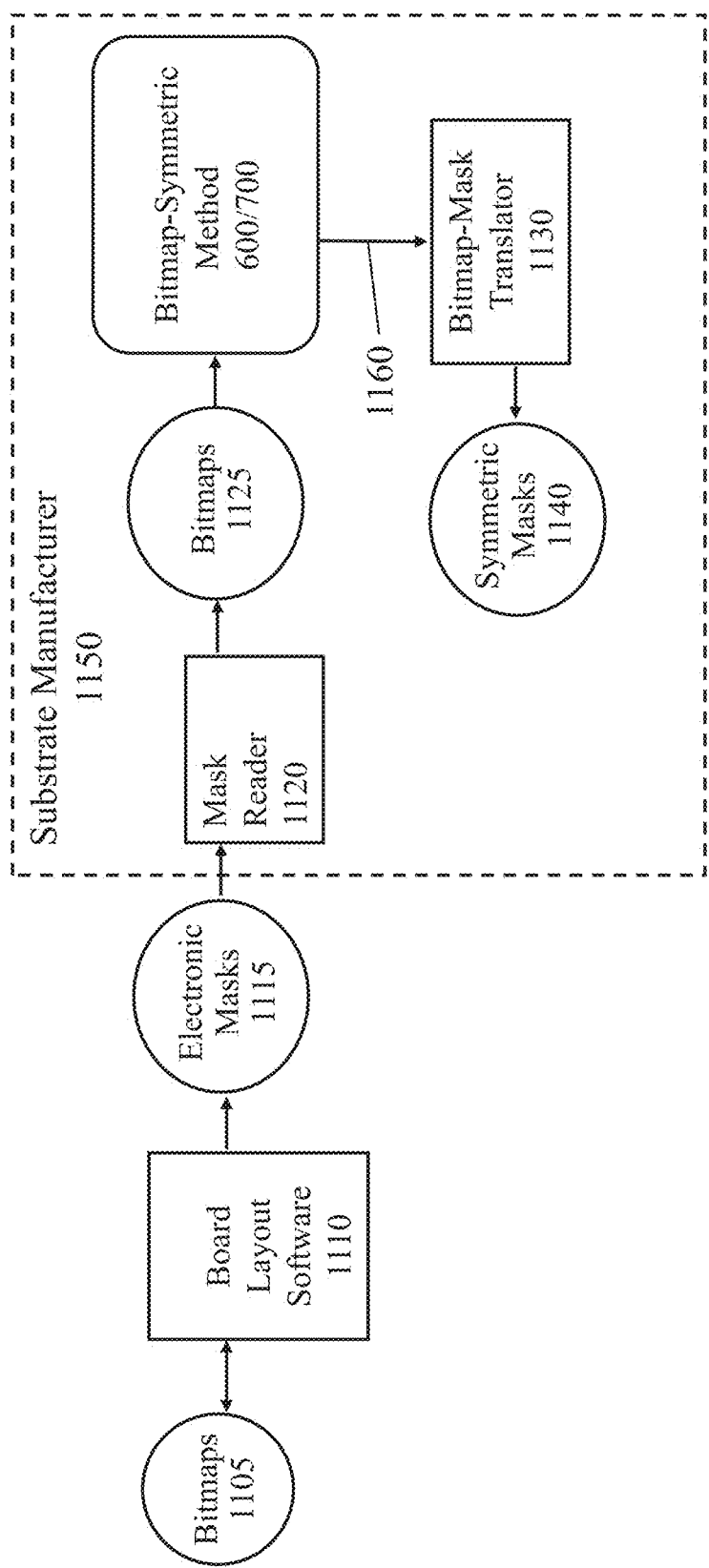
FIG. 11 is a flow chart showing how a bitmap-symmetric embodiment of the invention is integrated into a substrate manufacturing process for making symmetric masks for creating the layers.

FIG. 11 is a flow chart with a bitmap-symmetric embodiment integrated into a substrate manufacturing process 1100 for making symmetric masks for creating the layers 160/170 of the organic substrate 115.

In this non-limiting example, layouts of one or more layers 160/170 are represented by bitmaps 1105. Board layout software 1110 lays out the circuitry of the organic substrate 115 and electronic masks 1115 are created as a result. These steps 1105/1110/1115 can be done by parties (e.g. a developer) other than the substrate manufacturer 1150. The bitmap 1105 and masks 1115 represent the original upper 305 and lower 310 layouts with no thermomechanical symmetry that would be provided to the substrate manufacturer 1150.

Without access to the layout software 1110, the substrate manufacturer 1150 can read the masks 1115 with a mask reader 1120 and re-create the bitmap 1125 representation. The bitmap-symmetric methods 600/700 are applied and a bitmap mask translator 1130 creates masks 1140 used to make the organic substrates 115 with symmetric masks 1140 that are electrically equivalent to the original non-thermomechanical symmetric masks 1115 but now are thermomechanically symmetric 1140.

In alternative embodiments, the developer can use the bitmap-symmetric methods 600/700 directly on the bitmaps 1105 and provide the resulting thermo-mechanical symmetric designs 1160 to the substrate manufacturer which the substrate manufacturer can used as a direct input into the bitmap-mask translator 1130.

These embodiments are attractive to substrate manufacturers 1150 who do not have access to the board layout software 1110 or the expertise to operate this type of software 1110. Since the electronic masks 1115 are in industry standard format, this method 1100 works with any design, independent of the layout software 1110. There are a variety of mask reader software 1120 and bitmap mask translator 1130 software available to substrate manufactures 1150 at low cost that would facilitate implementation of the methods 600/700.

Figure 12:
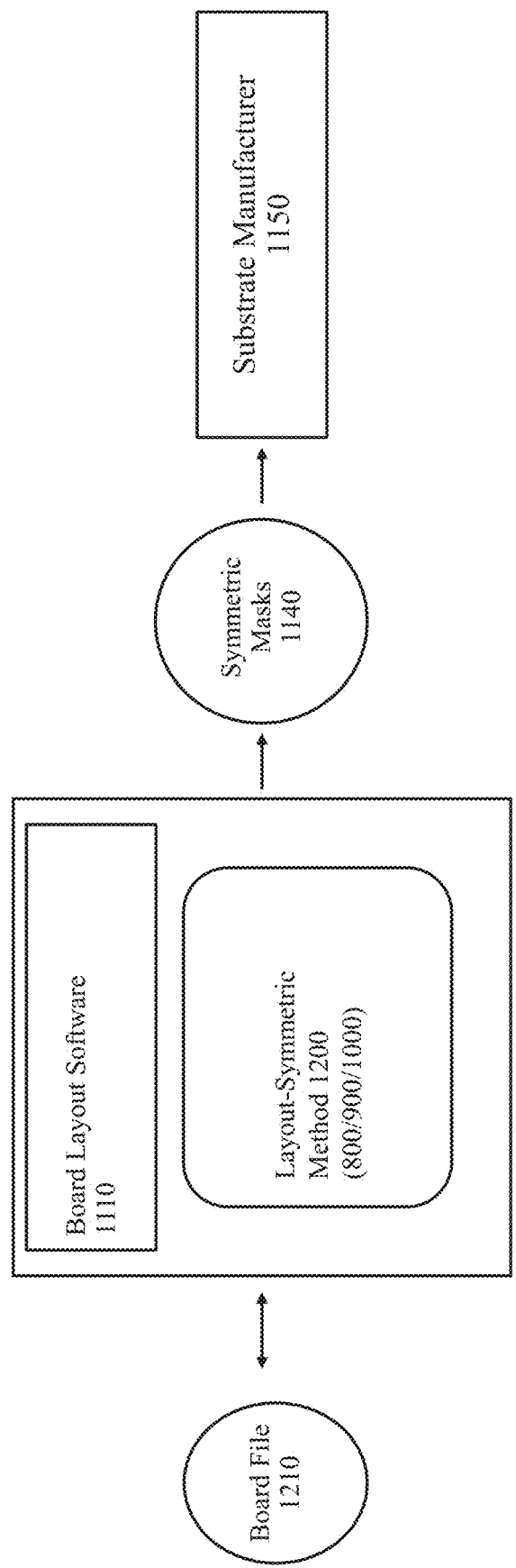
FIG. 12 is a flow chart showing how a layout-symmetric embodiment of the invention is used to create masks used by a substrate manufacture to create layers in laminated structures.

FIG. 12 is a flow chart showing how a layout-symmetric embodiment is used in a manufacturing process 1200 by a substrate manufacture 1150 to create layers 160/170 in organic structures 115.

The layout-symmetric method 1200 (e.g. using methods 500/800/900/1000) has the advantage that testing protocols of the board layout software 1110 can be implemented. This testing can identify artifacts, e.g. 661, that need to be corrected so that flaws in the design can be identified and corrected early in the design process. However, the layout-symmetric method 1200 generally needs to be developed and integrated for each board layout program 1100. This customization might have to be implemented for each object type, e.g. implemented by processes 800/900/1000.

Once integrated, this method 1200 runs inside existing board layout software 1110. The board designer/developer can input a board file 1210 and perform the full suite of modeling and electrical rule checking functions available on the symmetric design 1140 before the completed design is released to the substrate manufacturer 1150 for manufacturing.

FIGS. 13, 14, 15, and 16 show different aspects of an actual layers 160/170 of an organic substrate 115 designed to be symmetrical. In these examples, each of the layers 160/170 was divided 175/275 into 36 tile subareas 161/171 in a 6×6 matrix. The corresponding (upper 161 and lower 171) tile subareas are in a corresponding layer pair 215 where the upper layer 160 is the $4^{th}$ layer above the reference plane 120 and the lower layer is in the $5^{th}$ layer below the reference plane 120, approximately symmetrical about the reference plane 120. In the representations in the FIGS. 13, 14, 15, and 16, the white areas represent surfaces on the layers 160/170 that have metallic, e.g. copper 130, deposited. The black areas are exposed resin 110 with no metal/copper 130 deposited.

Figure 13:
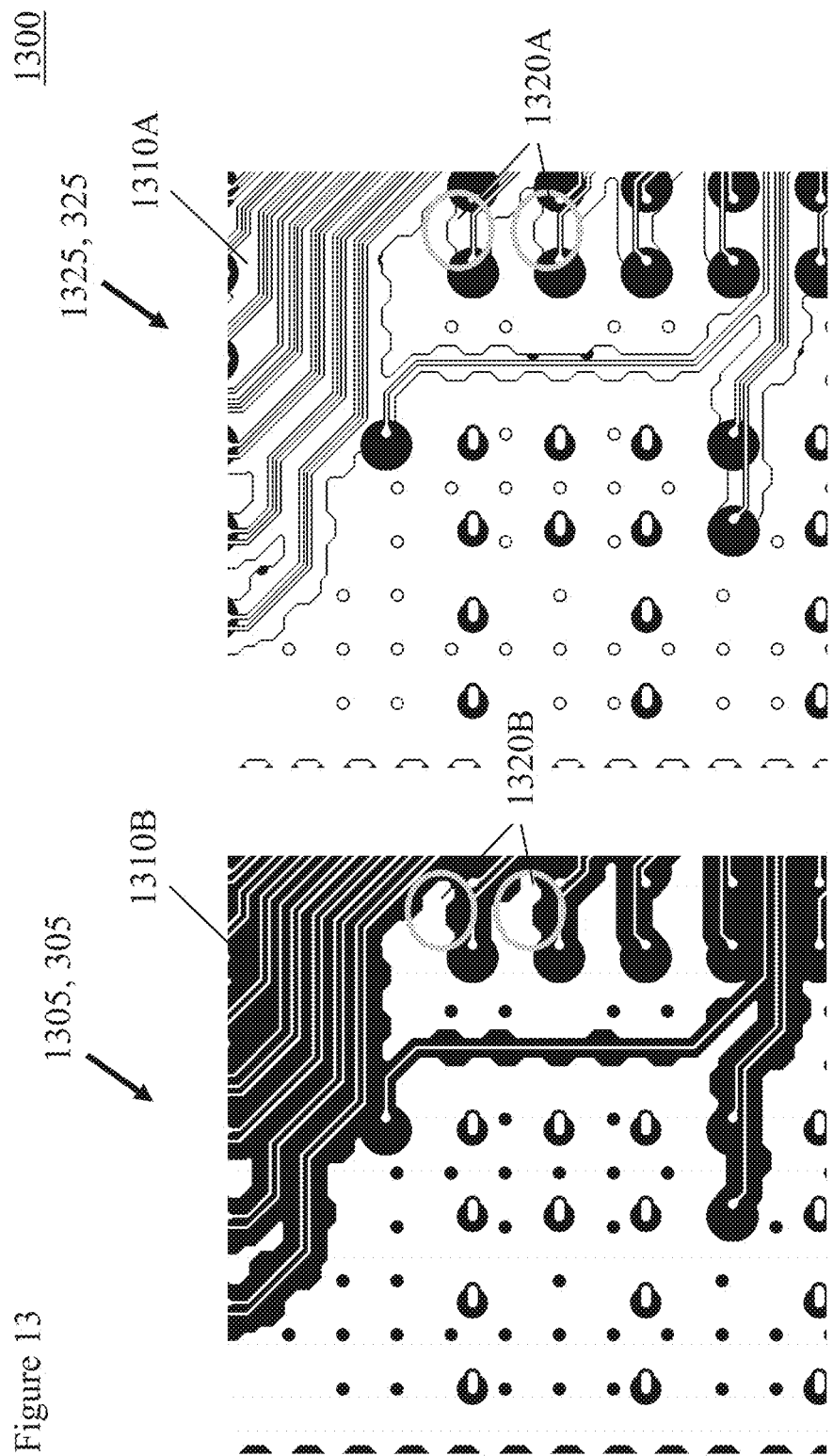
FIG. 13 shows an original upper tile subarea prior to and after being made symmetric.

FIG. 13 shows an original 305/1305 upper tile subarea 161 prior to 1310 being made symmetric 325. Structure 325/1325 is the symmetric upper layer 325 and after 1320 being made symmetric.

As shown, areas 1310B and 1320B with no metallic layer 130 in the original 305 upper tile layer and have metallic deposits 1310A and 1320A after the upper tile subarea is made into the symmetric upper layer 325. These added regions of metal/copper 1310A and 1320A result from a need to balance the effects of metal in these area in the corresponding lower subarea 171, not shown. In this non-limiting example, the copper area on the upper tile subarea 325 increased from 66 percent to 84 percent of the total area.

Figure 14:
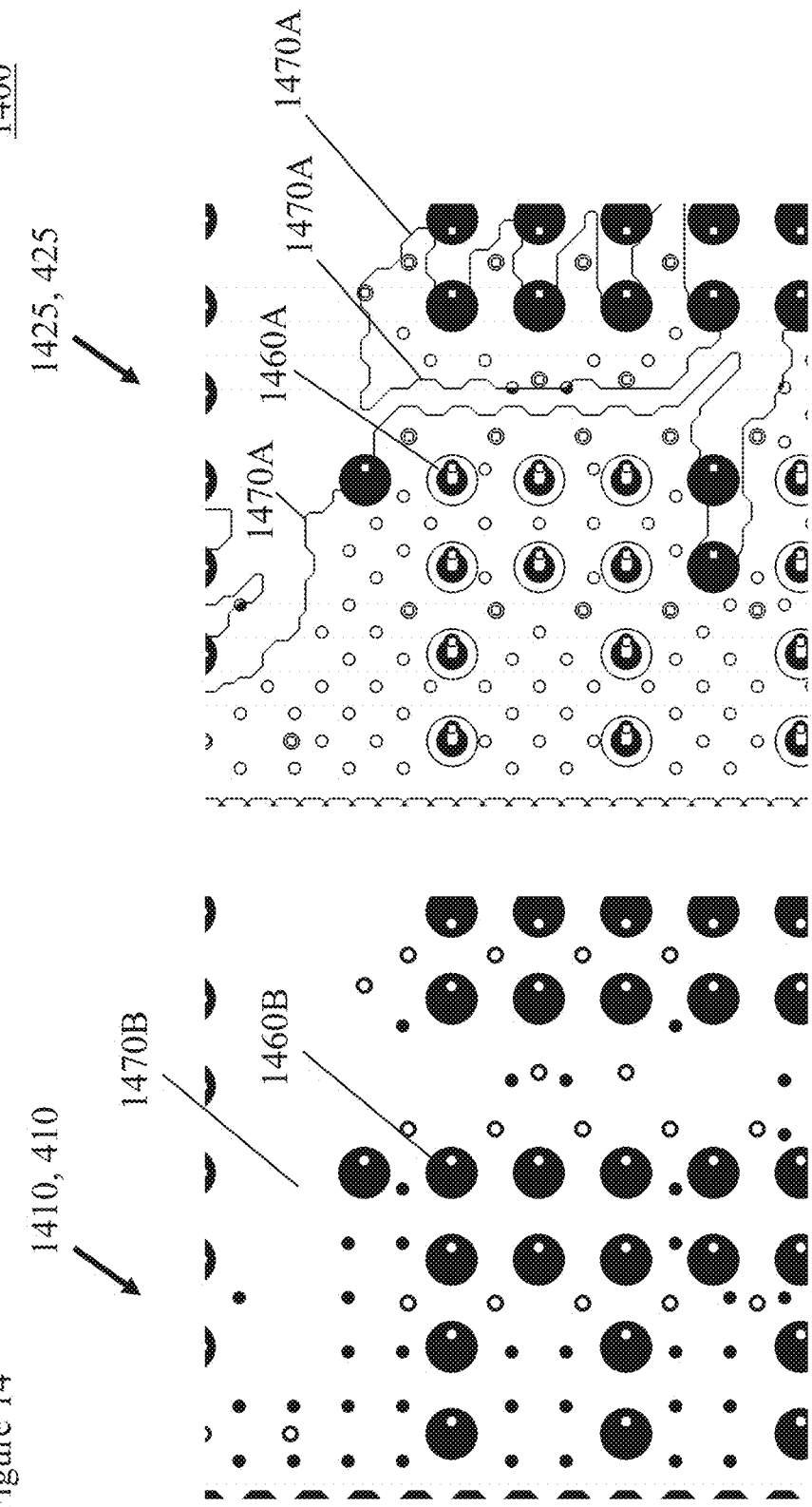
FIG. 14 shows an original lower tile subarea prior to and after being made symmetric.

FIG. 14 shows an original 1410/410 lower tile subarea 171 prior to 1410 being made symmetric 425. Structure 1425/425 is the symmetric lower layer 425 and after 1425 being made symmetric.

Typically, the symmetric lower layer 425 has more metal/copper 130 surrounding via penetrations than the original 1410/410 lower tile subarea. Note that spacing is maintained 1460A so the via does not connect/short circuit to the added metal.

In addition, the areas where there was a continuous copper plane 1470B in the original lower tile subarea 1410/410, are is now segmented 1470A, e.g. separated by resin 110 exposed lines 1470A.

Figure 15:
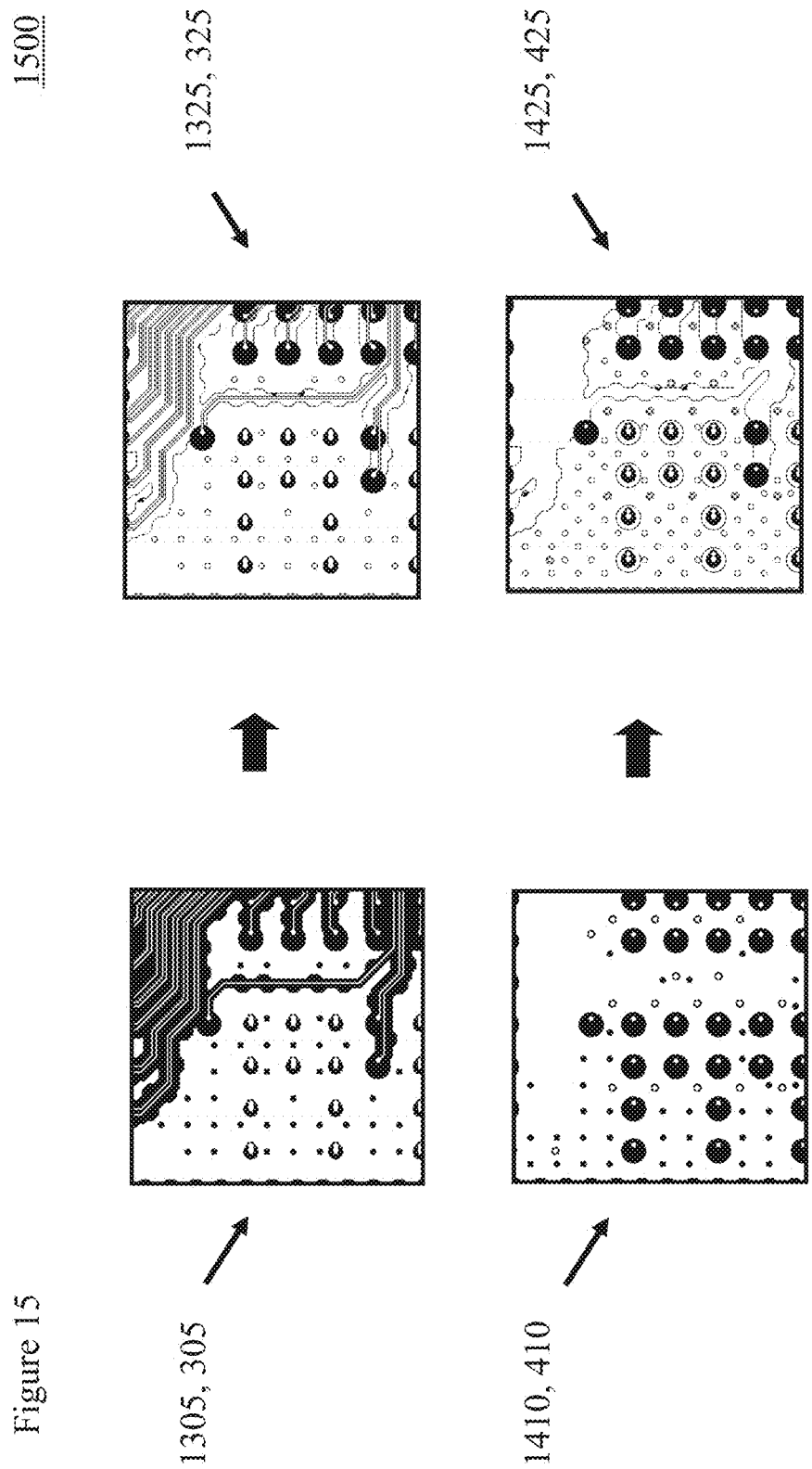
FIG. 15 is a side-by-side comparison of the example original upper tile subarea and the resulting symmetric upper layer and the original lower tile subarea and the resulting symmetric lower layer.

FIG. 15 is a side-by-side comparison of the example original upper tile 1305/305 subarea 161 and the resulting symmetric upper layer 1325/325 and the original lower tile 1410/410 subarea 161 and the resulting symmetric lower layer 1425/425.

Comparison of the areas of metal/copper surfaces reveals that there is a 17 percent imbalance between the original upper tile 1305/305 subarea 161 and the original lower tile 1410/410 subarea 161. After performing the symmetric layout processes (e.g. 300 and 400), the percent imbalance between the resulting symmetric upper tile 1325/325 subarea 161 and the resulting symmetric lower tile 1425/425 subarea 161 was reduced to 2 percent.

In some embodiments, the original lower layers/layouts 305 have more metallic surface 130 than the original upper layers/layouts 405. This tendency exists because the lower layers/layouts 305 are closer to the external connections 114/135 and have more of the power connections/planes while the original upper layers/layouts 405 are closer to the chip 150 connections 112 and have more thinner, low current, connections.

Accordingly, the symmetric layout processes (e.g. 300 and 400) tend to add electrically non-functioning metallic upper sub-patterns 161 to the resulting symmetric upper layer 1325/325 to thermo-mechanically balance the warp effects of the larger, electrically functioning corresponding lower metallic sub-patterns 171 in the respective correspond layer pair 215.

As stated above, artifacts, e.g., electrical short or open circuits, in sub-patterns 124/126 can occur after performance of the symmetric layout processes (e.g. 300 and 400) creating the symmetric upper 325 and lower 425 layout.

These artifacts can be found during the testing phase where electrical and thermo-mechanical models find, and can correct, these design errors.

Figure 16:
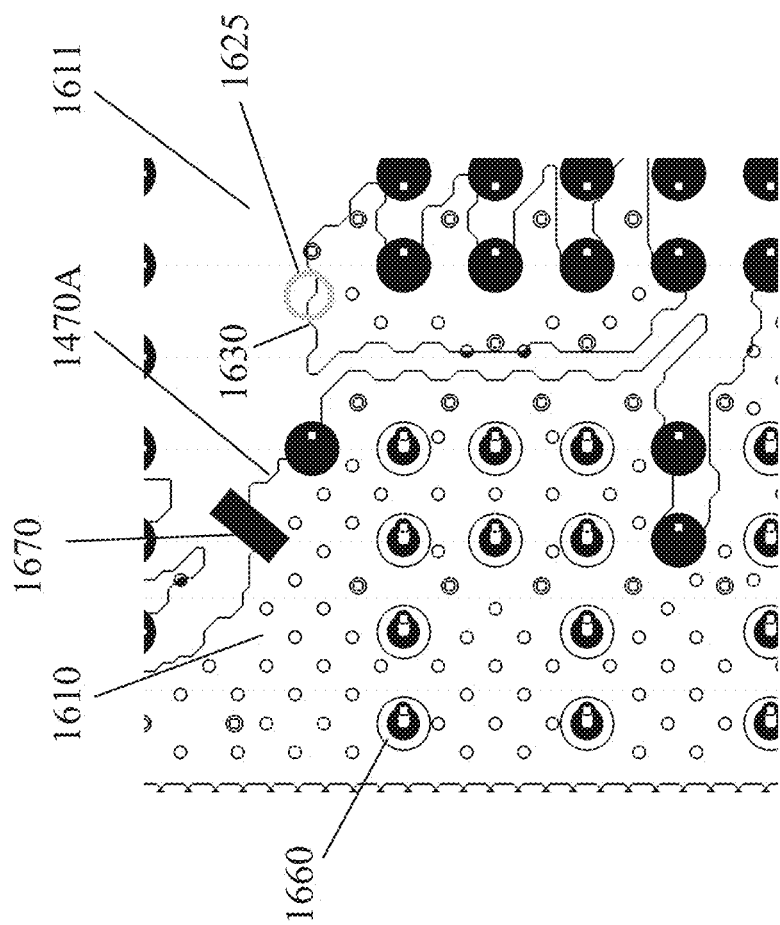
FIG. 16 is a diagram showing example design corrections made to a symmetric lower layout.

FIG. 16 is a diagram shows example design corrections 1600 made to a symmetric lower 425 layout.

Non-limiting examples of artifact corrections include:
1. An electrical connection 1670 is added to re-connect metallic regions 1610/1611 that were originally electrically connected as a continuous copper plane 1470B but were disconnected by the segmenting resin line 1470A.
2. The line width of the resin-exposed separation line 1630 is increased to insure electrical isolation of an added electrically non-functioning metal region 1625.
3. The addition of a metal region around one or more of the vias is blocked 1660 because the reduced warp gained by adding the metal is not worth the risk of short circuiting the via.

Figure 17:
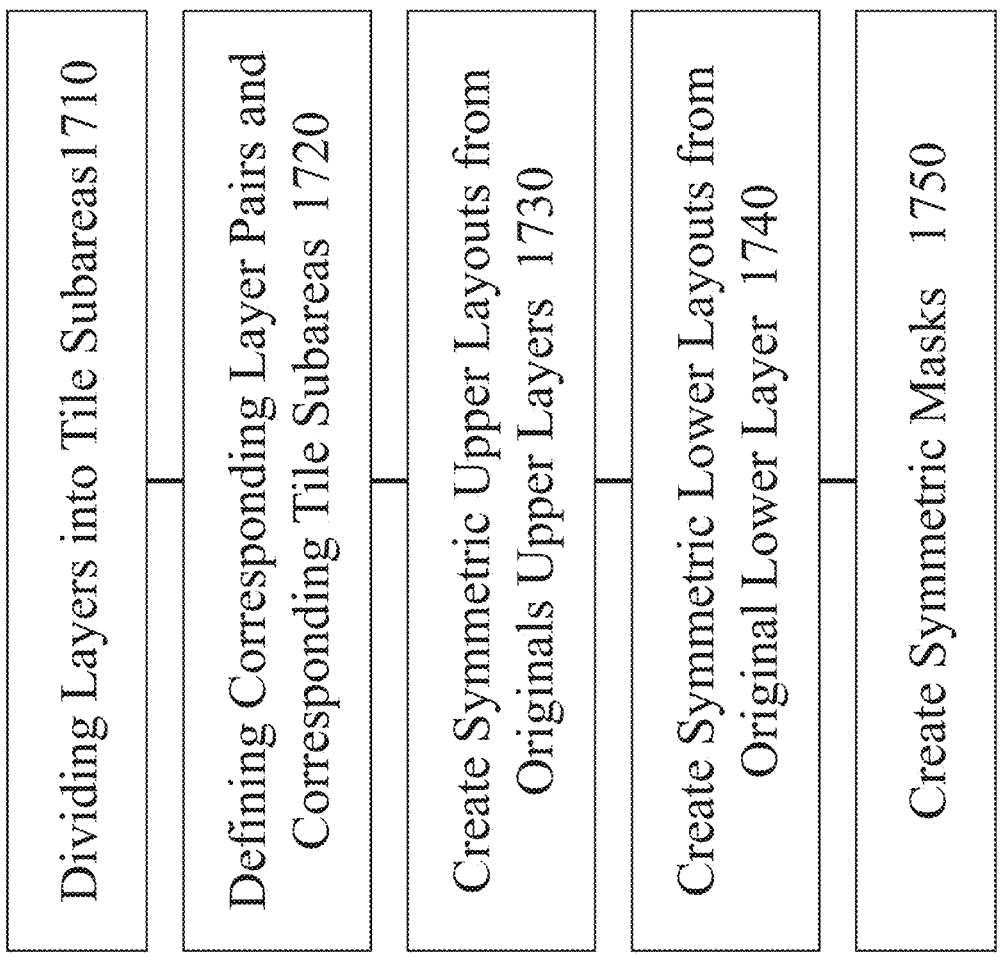
FIG. 17 is a high-level flow chart describing steps of the methods of making an organic substrate.

FIG. 17 is a high-level flow chart describing steps of a method 1700 of making an organic substrate 115.

The method 1700 begins with dividing 1710 the layers into tile subareas 171 with a vertical projection 175/275 as described above.

In step 1720 one or more corresponding layer pairs 215 are defined. The upper 161 and lower 171 corresponding tile subareas are also defined.

In step 1730 the symmetric upper layouts 325 and, in step 1740, the symmetric lower layouts 425 are created as described above.

In step 1750 symmetric masks 1750 are made using various manufacturing processed described above.

The descriptions of the various embodiments of the present invention have been presented for purposes of illustration but are not intended to be exhaustive or limited to the embodiments disclosed. Given this disclosure, many modifications and variations will be apparent to those of ordinary skill in the art without departing from the scope and spirit of the described embodiments.

The terminology used herein was chosen to best explain the principles of the embodiments, the practical application or technical improvement over technologies found in the marketplace, or to enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. An organic substrate comprising:
   one or more layers made of non-conductive material, each of the layers having one or more tile subareas, one or more of the layers being an upper layer on an upper side of a flat reference plane and one or more of the layers being a lower layer on a lower side of the flat reference plane;
   one or more corresponding layer pairs, each corresponding layer pair having one of the upper layers, being a corresponding upper layer, and one of the lower layers, being a corresponding lower layer, where the corresponding upper layer and the corresponding lower layer are equidistant from and symmetric about the flat reference plane;
   one or more corresponding tile subareas, each of the corresponding tile subareas having an upper tile subareas in the corresponding upper layer, being a corresponding upper tile subarea, and a lower tile subareas in the corresponding lower area, being a corresponding lower tile subarea, where the corresponding upper tile subarea and the corresponding lower tile subarea are in a same vertical projection;
   a symmetric upper layout made of a conductive material disposed on one of the corresponding upper tile subareas, the symmetric upper layouts having one or more upper portions that have no electrical function being non-electrically functioning upper portions; and
   a symmetric lower layout made of the conductive material disposed on the respective corresponding lower tile subarea, the symmetric lower layouts having one or more lower portions that have no electrical function, being non-electrically functioning lower portions, the non-electrically functioning lower portions having one or more of the lower non-electrically functioning portions,
wherein the lower non-electrically functioning portions are equal in shape with a logical intersection of an aggregate of extracted lower major features from the respective corresponding lower tile subarea and an aggregate of extracted upper major features in the corresponding upper tile subarea, and
wherein the conductive material in the symmetric upper layout and the symmetric lower layout, respectively, are equal in surface area within a tolerance and are vertical projections of one another.

2. The organic substrate, as in claim 1, where the conductive material is copper and the non-conductive material is resin.

3. The organic substrate, as in claim 1, where one or more of the non-electrically functioning upper portions, are the same size, and are a vertical projection of a lower major feature in the symmetric lower layout.

4. The organic substrate, as in claim 3, where the lower major feature has an electrical function in the corresponding lower layer.

5. The organic substrate, as in claim 3, where the one or more of the upper portions are one or more of the following: a broken line, a polygon shape with cut by a channel, and a first polygon shape intersecting a second polygon shape electrically disconnected by a gap.

6. The organic substrate, as in claim 1, where one or more of the non-electrically functioning lower portions, are the same size, and are a vertical projection of an upper major feature in the symmetric upper layout.

7. The organic substrate, as in claim 6, where the upper major feature has an electrical function in the corresponding upper layer.

8. The organic substrate, as in claim 6, where the one or more of the lower portions are one or more of the following: a broken line, a polygon shape with cut by a channel, and a first polygon shape intersecting a second polygon shape electrically disconnected by a gap.

9. An organic substrate comprising:
   one or more layers made of non-conductive material, each of the layers having one or more tile subareas, one or more of the layers being an upper layer on an upper side of a flat reference plane and one or more of the layers being a lower layer on a lower side of the flat reference plane;
   one or more corresponding layer pairs, each corresponding layer pair having one of the upper layers, being a corresponding upper layer, and one of the lower layers, being a corresponding lower layer, where the corresponding upper layer and the corresponding lower layer are equidistant from and symmetric about the flat reference plane;

one or more corresponding tile subareas, each of the corresponding tile subareas having an upper tile subarea in the corresponding upper layer, being a corresponding upper tile subarea, and a lower tile subarea in the corresponding lower area, being a corresponding lower tile subarea, where the corresponding upper tile subarea and the corresponding lower tile subarea are in a same vertical projection;

a symmetric upper layout made of a conductive material disposed on one of the corresponding upper tile subareas, the symmetric upper layout having one or more upper portions that have no electrical function, being non-electrically functioning upper portions; and a symmetric lower layout made of the conductive material disposed on the respective corresponding lower tile subarea, the symmetric lower layout having one or more lower portions that have no electrical function, being non-electrically functioning lower portions, the non-electrically functioning lower portions having one or more of the lower non-electrically functioning portions, wherein the lower non-electrically functioning portions are equal in shape with a logical intersection of an aggregate of extracted lower major features from the respective corresponding lower tile subarea and an aggregate of extracted upper major features in the corresponding upper tile subarea, and wherein the conductive material in the symmetric upper layout and the symmetric lower layout, respectively, are equal in surface area within a tolerance and are vertical projections of one another, and wherein the symmetric lower layout and the symmetric upper layout are thermo-mechanically symmetric.

10. The organic substrate, as in claim 9, wherein flat reference plane is a core made of one of a fiber reinforced organic material and a resin material.

11. The organic substrate, as in claim 10, where the flat reference plane is between 400 micrometers (μm) and 800 thick.

12. The organic substrate, as in claim 9, where one or more semiconductor chips is attached to a top surface of the organic substrate.

13. The organic substrate, as in claim 9, where one or more of the upper portions do have an electrical function and one or more of the lower portions do not have an electrical function, and where the respective lower portions having no electrical function and the respective upper portions having an electrical function are in the same corresponding layer pair and correspond to one another.

14. The manic substrate, as in claim 13, where one or more of the lower portions that have no electrical function reduce warp of the organic substrate by providing part of a region of metal surface that is equal in area to and symmetric about the flat reference plane with the respective upper portions that have the electrical function.

15. The organic substrate, as in claim 9, where one or more of the lower portions do have an electrical function and one or more of the upper portions do not have an electrical function, and where the respective upper portions having no electrical function and the respective lower portions having an electrical function are in the same corresponding layer pair and correspond to one another.

16. The organic substrate, as in claim 15, where one or more of the upper portions that have no electrical function reduce warp of the organic substrate by providing part of a region of metal surface that is equal in area to and symmetric about the flat reference plane with the respective lower portions that have the electrical function.

17. The organic substrate, as in claim 9, where the tolerance is 2 percent or less.

18. The organic substrate, as in claim 9, with a surface area greater than 40×40 millimeters.

19. The organic substrate, as in claim 9, where the symmetric lower layout and the symmetric upper layout do not have short circuits.

* * * * *